United States Patent
Chang et al.

(10) Patent No.: US 12,015,066 B2
(45) Date of Patent: Jun. 18, 2024

(54) TRIPLE LAYER HIGH-K GATE DIELECTRIC STACK FOR WORKFUNCTION ENGINEERING

(71) Applicant: Taiwan Semiconductor Manufacturing Co., Ltd., Hsinchu (TW)

(72) Inventors: Chia-Yuan Chang, Hsinchu (TW); Te-Yang Lai, Hsinchu (TW); Kuei-Lun Lin, Hsinchu (TW); Xiong-Fei Yu, Hsinchu (TW); Chi On Chui, Hsinchu (TW); Tsung-Da Lin, Hsinchu (TW); Cheng-Hao Hou, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/231,649

(22) Filed: Apr. 15, 2021

(65) Prior Publication Data
US 2021/0399104 A1    Dec. 23, 2021

Related U.S. Application Data

(60) Provisional application No. 63/040,314, filed on Jun. 17, 2020.

(51) Int. Cl.
*H01L 29/423* (2006.01)
*H01L 21/8234* (2006.01)
(Continued)

(52) U.S. Cl.
CPC ........... *H01L 29/42364* (2013.01); *H01L 21/823431* (2013.01); *H01L 21/823462* (2013.01);
(Continued)

(58) Field of Classification Search
CPC ......... H01L 29/42364; H01L 29/42392; H01L 21/823462; H01L 21/823857
See application file for complete search history.

(56) References Cited

U.S. PATENT DOCUMENTS 6,027,961 A     2/2000  Maiti et al.
6,166,417 A    12/2000  Bai et al.
(Continued)

FOREIGN PATENT DOCUMENTS

KR    1020170041605    4/2017
KR    1020190000965    1/2019
(Continued)

OTHER PUBLICATIONS

Lung-Kun Chu et al., "Dipole Patterning for CMOS Devices", U.S. Appl. No. 16/879,613, filed May 20, 2020, Assignee: Taiwan Semiconductor Manufacturing Co., Ltd., 31 pages specification, 26 pages drawings.

*Primary Examiner* — Tuan A Hoang
(74) *Attorney, Agent, or Firm* — Haynes and Boone, LLP

(57) ABSTRACT

A method includes providing first and second channel layers in NMOS and PMOS regions respectively of a substrate; depositing a first layer comprising hafnium oxide over the first and second channel layers; forming a first dipole pattern over the second channel layer and not over the first channel layer; driving a first metal from the first dipole pattern into the first layer by annealing; removing the first dipole pattern; depositing a second layer comprising hafnium oxide over the first layer and over the first and second channel layers; forming a second dipole pattern over the second layer and the first channel layer and not over the second channel layer; driving a second metal from the second dipole pattern into the second layer by annealing; removing the second dipole pattern; and depositing a third layer comprising hafnium
(Continued)

oxide over the second layer and over the first and the second channel layers.

20 Claims, 23 Drawing Sheets

(51) Int. Cl.
  *H01L 27/092* (2006.01)
  *H01L 29/78* (2006.01)
(52) U.S. Cl.
  CPC ........ *H01L 27/0924* (2013.01); *H01L 29/785* (2013.01); *H01L 2029/7858* (2013.01)

(56) References Cited

U.S. PATENT DOCUMENTS

| | | | |
|---|---|---|---|
| 6,335,534 B1 | 1/2002 | Suguro et al. | |
| 6,417,565 B1 | 7/2002 | Komatsu | |
| 6,458,695 B1 | 10/2002 | Lin et al. | |
| 6,483,151 B2 | 11/2002 | Wakabayashi et al. | |
| 6,506,676 B2 | 1/2003 | Park et al. | |
| 6,653,698 B2 | 11/2003 | Lee et al. | |
| 6,984,591 B1* | 1/2006 | Buchanan | C23C 16/16 |
| | | | 257/E21.174 |
| 7,564,102 B2 | 7/2009 | Yoshihara | |
| 2002/0001906 A1 | 1/2002 | Park | |
| 2007/0128736 A1 | 6/2007 | Chang et al. | |
| 2009/0302369 A1 | 12/2009 | Guha | |
| 2010/0219481 A1* | 9/2010 | Tseng | H01L 21/823857 |
| | | | 257/369 |
| 2010/0330812 A1 | 12/2010 | Akiyama | |
| 2012/0049297 A1 | 3/2012 | Takeoka | |
| 2013/0270512 A1* | 10/2013 | Radosavljevic | H01L 29/775 |
| | | | 438/212 |
| 2017/0005006 A1* | 1/2017 | Ando | H01L 21/28185 |
| 2017/0256455 A1 | 9/2017 | Kim et al. | |
| 2020/0091145 A1 | 3/2020 | Guha | |
| 2020/0388708 A1* | 12/2020 | Koezuka | H01L 29/7869 |

FOREIGN PATENT DOCUMENTS

| | | |
|---|---|---|
| KR | 1020190031855 | 3/2019 |
| KR | 1020190038224 | 4/2019 |
| TW | 200710921 A | 3/2007 |

* cited by examiner

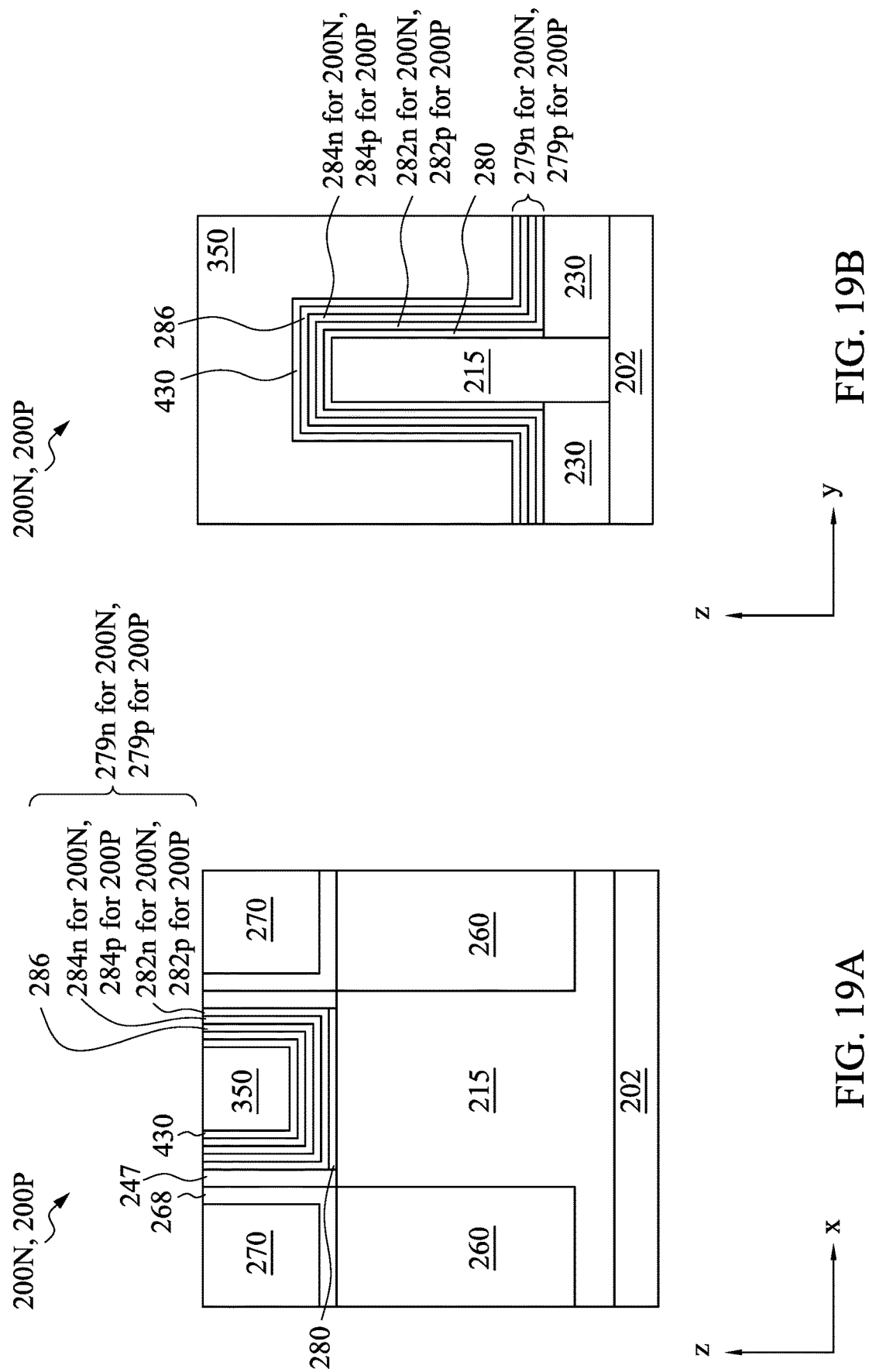

TRIPLE LAYER HIGH-K GATE DIELECTRIC STACK FOR WORKFUNCTION ENGINEERING

PRIORITY

This application claims the benefits to U.S. Provisional Application Ser. No. 63/040,314 filed Jun. 17, 2020, the entire disclosure of which is incorporated herein by reference.

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology. One area of advances is how to provide CMOS devices with proper threshold voltages (Vt) for both NMOS and PMOS transistors for boosting performance while reducing power consumption. Particularly, Vt engineering has been challenging as devices continue to scale down to multi-gate devices, such as FinFET, gate-all-around (GAA) devices including nanowire devices and nanosheet devices, and other types of multi-gate devices. One reason is that these devices are very small and there is not much room for tuning their Vt's using different work function metals.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 4, 5, 6, 7, 8, 9, 10, 11, 12, 13, 14, 15, 16, 17, 18A, 18B, 18C, 19A, and 19B are diagrammatic cross-sectional views of the CMOS device in FIG. 3A, in portion, at various fabrication stages (such as those associated with the method in FIG. 2) according to various aspects of the present disclosure.

DETAILED DESCRIPTION

Figure 1:
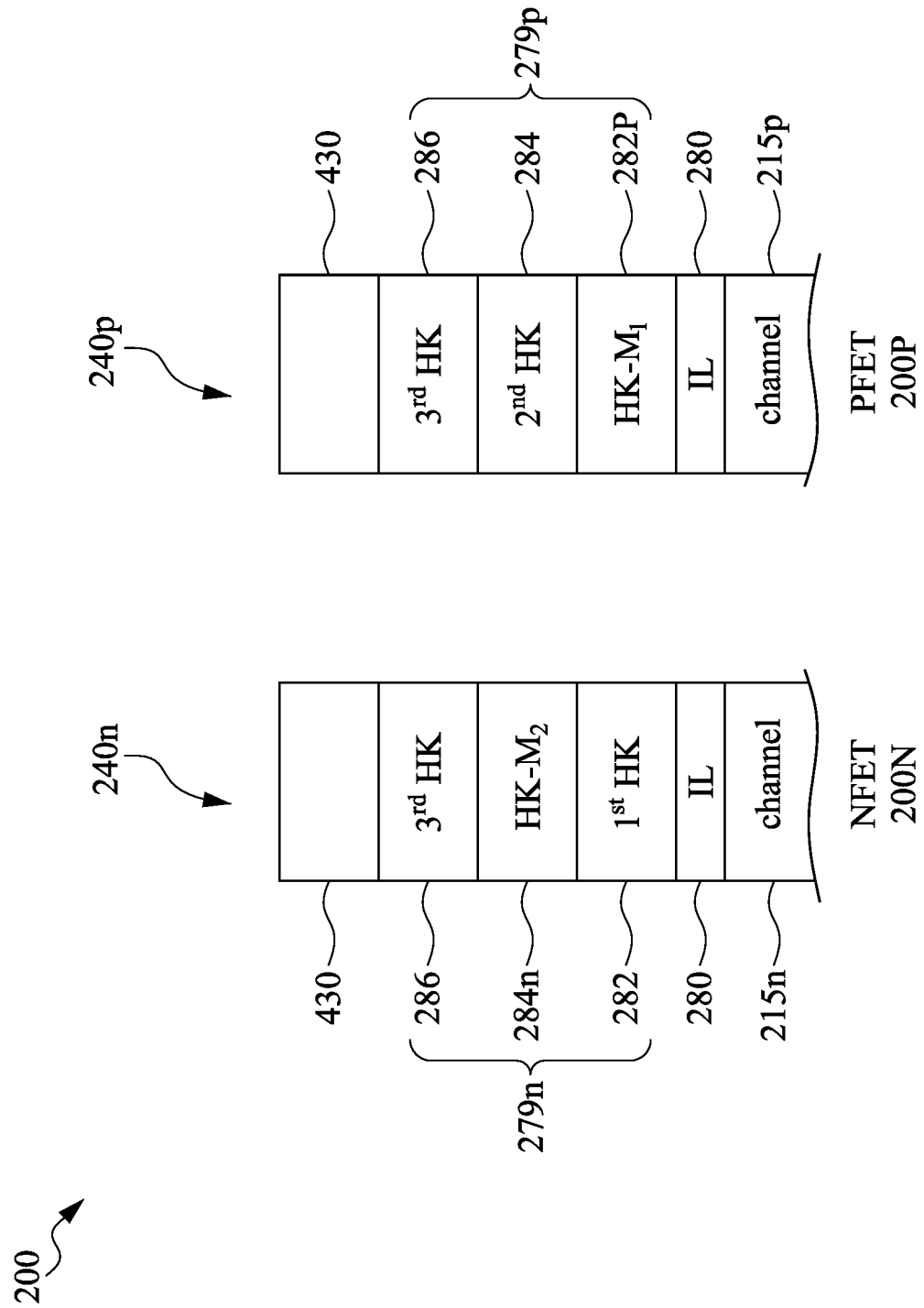
FIG. 1 is a diagrammatic view of a CMOS device, in portion, with a triple layer high-k gate dielectric stack for work function tuning according to the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, from 4.0 nm to 5.0 nm, and so on.

The present disclosure relates generally to semiconductor structures and fabrication processes thereof, and more particularly to CMOS devices with high-k metal gates having a triple layer high-k gate dielectric stack for tuning gate work function such that both NMOSFET (or NFET) and PMOSFET (or PFET) can have optimized work functions. Device Vt (threshold voltage) tuning has become more and more challenging due to the continued down-scaling of device size and device pitch. Some approaches use a work function metal with high aluminum concentration for NFET Vt tuning. However, this might degrade device reliability performance due to the high diffusivity of aluminum. Some approaches use a thick p-type work function metal for PFET Vt tuning. However, filling such thick work function metal in small devices (such as small FinFET or GAA devices) has become more and more difficult. Unlike those approaches, the present disclosure utilizes a triple layer high-k gate dielectric stack (or triple layer high-k stack) for tuning Vt for both NFET and PFET. A common thin layer of work function metal can be used for both NFET and PFET. This common thin layer of work function metal is disposed over the triple layer high-k stack. The triple layer high-k stack is disposed over an interfacial layer that is disposed over a semiconductor channel (such as Si channel or SiGe channel). Since only a thin layer of work function metal is used, filling of such work function metal into small gate trenches (such as in FinFET devices and in GAA devices) is no longer an issue. The triple layer high-k stack includes dipole material(s) in lower layers of the stack for adjusting the Vt, for example, by about 50 mV to about 300 mV in some instance. The upper layer of the stack is free from the dipole material. Therefore, the work function metal layer is not affected by out-diffusion of the dipole materials.

FIG. 1 illustrates a schematic view of a portion of a device 200 implemented with such triple layer high-k stack of the present disclosure, according to an embodiment. The device 200 is a CMOS device, having an NFET 200N and a PFET 200P. The NFET 200N includes a gate stack 240n over a channel layer 215n. The PFET 200P includes a gate stack 240p over a channel layer 215p. In the embodiment depicted in FIG. 1, the channel layer 215n includes silicon (such as crystalline silicon or intrinsic silicon), while the channel layer 215p includes silicon (such as crystalline silicon or intrinsic silicon), germanium, or silicon germanium. In alternative embodiments, the channel layers 215n and 215p may include other suitable semiconductor materials. The gate stack 240n includes an interfacial layer 280 (such as $SiO_2$ or SiON), a triple-layer high-k stack 279n, and a work function metal layer 430. The gate stack 240p includes the interfacial layer 280, a triple-layer high-k stack 279p, and the work function metal layer 430.

In the embodiment depicted in FIG. 1, the triple layer high-k stack 279p has a base layer 282p, a middle layer 284, and an upper layer 286. Each of the three layers 282p, 284, and 286 includes a high-k dielectric material such as hafnium oxide in the present embodiment. In alternative embodiments, each of the three layers 282p, 284, and 286 may include other high-k dielectric materials such as HfSiO, $HfSiO_4$, HfSiON, HfLaO, HfTaO, HfTiO, HfZrO, hafnium-aluminum-oxide (i.e., $HfAlO_x$), hafnium dioxide-alumina ($HfO_2$—$Al_2O_3$) alloy, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, $Nb_2O_3$, HfNbOx, ZnO, $HfZnO_x$. The base layer 282p further includes another metal $M_1$ (a doping metal or a dipole metal) selected for PFET tuning. For example, the metal $M_1$ is selected such that the compound of the high-k dielectric material and $M_1$ in the layer 282p (such as hafnium-$M_1$-oxide) provides an upward adjustment to the work function of the gate stack 240p. In other words, having $M_1$ in the base layer 282p shifts the work function of the gate stack 240p closer to the valence band than the same gate stack without the metal $M_1$. This is due to the diffusion of the metal $M_1$ towards the 282p/280 interface and the dipole formation thereof. At the same time, the layers 284 and 286 prevents the diffusion of the metal $M_1$ to the work function metal layer 430, thereby maintaining the integrity and reliability of the PFET 200P. In some embodiments, the metal $M_1$ can be aluminum (Al), niobium (Nb), or another suitable metal such as Ga, Zn, Ti.

In the embodiment depicted in FIG. 1, the triple layer high-k stack 279n has a base layer 282, a middle layer 284n, and the upper layer 286. Each of the three layers 282, 284n, and 286 includes a high-k dielectric material such as hafnium oxide in the present embodiment. In alternative embodiments, each of the three layers 282, 284n, and 286 may include another high-k dielectric material such as HfSiO, $HfSiO_4$, HfSiON, HfLaO, HfTaO, HfTiO, HfZrO, hafnium-aluminum-oxide (i.e., $HfAlO_x$), hafnium dioxide-alumina ($HfO_2$—$Al_2O_3$) alloy, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, $Nb_2O_3$, HfNbOx, ZnO, $HfZnO_x$. The middle layer 284n further includes another metal $M_2$ (a doping metal or a dipole metal) selected for NFET tuning. For example, the metal $M_2$ is selected such that the compound of the high-k dielectric material and $M_2$ in the layer 284n (such as hafnium-$M_2$-oxide) provides a downward adjustment to the work function of the gate stack 240n. In other words, having $M_2$ in the middle layer 284n shifts the work function of the gate stack 240n closer to the conduction band than the same gate stack without the metal $M_2$. This is due to the diffusion of the metal $M_2$ towards the 282/280 interface and the dipole formation thereof. At the same time, the layer 286 prevents the diffusion of the metal $M_2$ to the work function metal layer 430, thereby maintaining the integrity and reliability of the NFET 200N. In some embodiments, the metal $M_2$ can be lanthanum (La), yttrium (Y), strontium (Sr), or another suitable metal.

In an embodiment, each of the layers 282, 284, and 286 includes hafnium oxide ($HfO_2$), the layer 282p includes a compound of $HfO_2$ and the metal $M_1$, and the layer 284n includes a compound of $HfO_2$ and the metal $M_2$. Further, each of the layers 282, 282p, 284, 284n, and 286 has a thickness in a range of about 2 Å to 15 Å in some embodiments. So, the total thickness of each triple layer high-k stack 279n and 279p is about 6 Å to 45 Å. As will be discussed below, in an embodiment, the two layers 282 and 282p start out as a common layer for both NFET 200N and PFET 200P, then the layer 282p is doped with the metal $M_1$. Similarly, the two layers 284n and 284 start out as a common layer for both NFET 200N and PFET 200P, then the layer 284n is doped with the metal $M_2$.

By using the triple layer high-k stack of the present disclosure, both NFET and PFET can be tuned to have low Vt's, thereby reducing power consumption and boosting device performance. Thus, the present disclosure can be used to flexibly tune the threshold voltages for CMOS devices. Further, having a common thin layer of work function metal layer (such as the layer 430 in FIG. 1) for both NFET and PFET allows the gate stacks 240n and 240p to be fabricated for very small sized devices, such as FinFET and GAA devices whose channel length is only a few nanometers. The present disclosure can be applied to multi-gate CMOS devices, such as FinFET and gate-all-around (GAA) CMOS devices, as well as planar CMOS devices.

The details of the structure and fabrication methods of the present disclosure are described below in conjunction with the accompanied drawings, which illustrate a process of making a GAA device, according to some embodiments. A GAA device refers to a device having vertically-stacked horizontally-oriented multi-channel transistors, such as nanowire transistors and nanosheet transistors. GAA devices are promising candidates to take CMOS to the next stage of the roadmap due to their better gate control ability, lower leakage current, and fully FinFET device layout compatibility. The present disclosure also briefly discusses the implementation of the triple layer high-k stack in FinFET devices. Those of ordinary skill in the art should appreciate that they may readily use the present disclosure as a basis for designing or modifying other processes and structures for carrying out the same purposes and/or achieving the same advantages of the embodiments introduced herein.

Figure 2:
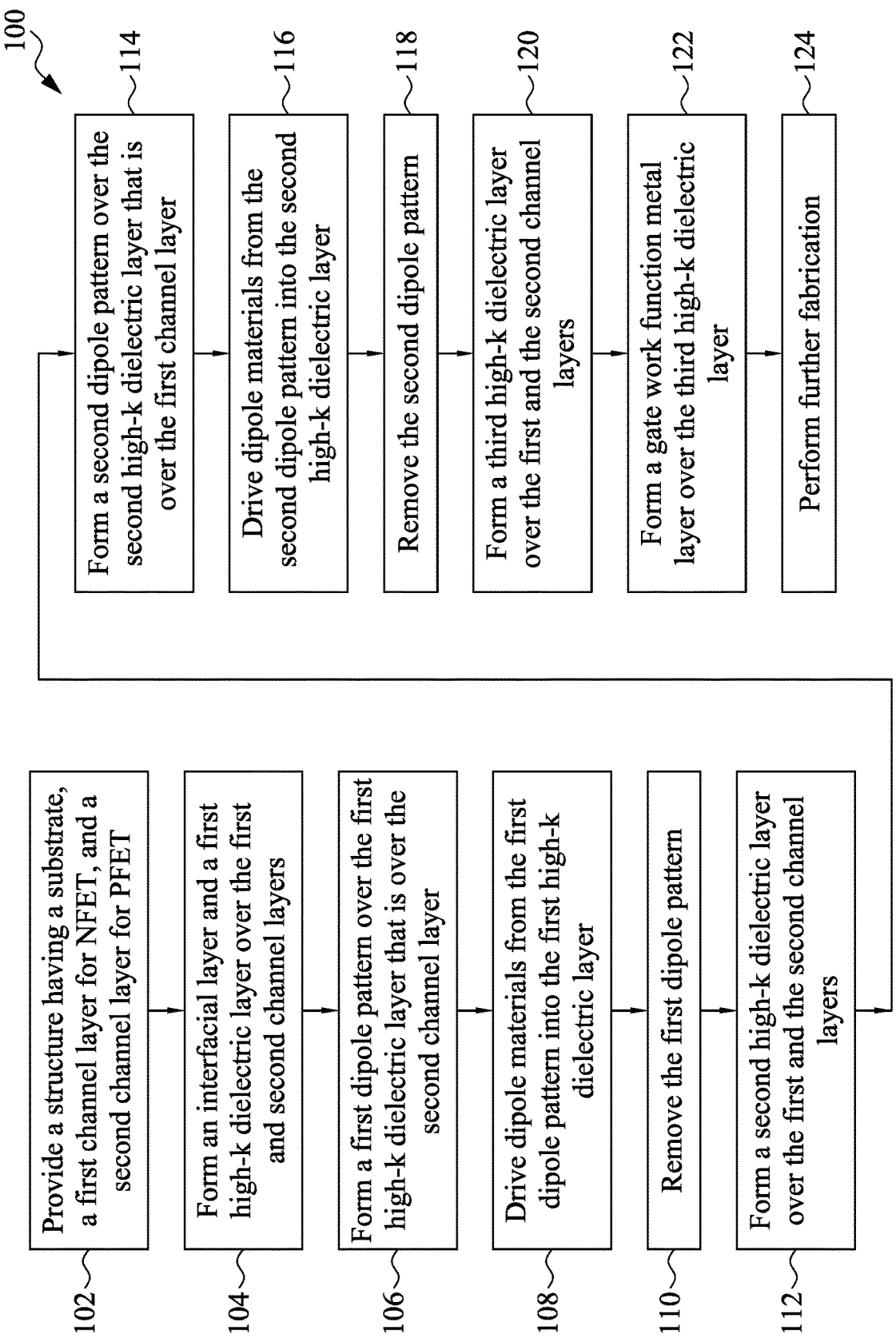
FIG. 2 is a flow chart of a method for fabricating a CMOS device according to various aspects of the present disclosure.

FIG. 2 is a flow chart of a method 100 for fabricating a CMOS device according to various aspects of the present disclosure. In some embodiments, the method 100 fabricates a multi-gate device that includes a p-type GAA transistor 200P and an n-type GAA transistor 200N. The method 100 is briefly described below.

At operation 102, an initial structure is provided. The initial structure includes an NFET device region for making NFETs and a PFET device region for making PFETs. The NFET device region includes first channel semiconductor layers (or first channel layers) suspended between a pair of first source/drain (S/D) features of n-type. The PFET device region includes second channel semiconductor layers (or second channel layers) suspended between a pair of second source/drain (S/D) features of p-type. The first and the second channel layers are exposed in gate trenches resulted from the removal of dummy gates. At operation 104, an interfacial layer and a first high-k dielectric layer are formed in the gate trenches around the first and the second channel layers. At operation 106, a first dipole pattern is formed over the first high-k dielectric layer in the PFET device region, and the first dipole pattern includes a compound of a metal $M_1$, such as an oxide of the metal $M_1$, a nitride of the metal $M_1$, or another suitable compound of the metal $M_1$. At operation 108, the structure is annealed so that the metal elements $M_1$ from the first dipole pattern are driven into the first high-k dielectric layer thereunder. At operation 110, the first dipole pattern is removed.

At operation 112, a second high-k dielectric layer is formed in the gate trenches over the first high-k dielectric layer and around the first and the second channel layers. At operation 114, a second dipole pattern is formed over the second high-k dielectric layer in the NFET device region, and the second dipole pattern includes a compound of a metal $M_2$, such as an oxide of the metal $M_2$, a nitride of the metal $M_2$, or another suitable compound of the metal $M_2$. At operation 116, the structure is annealed so that the metal elements $M_2$ from the second dipole pattern are driven into the second high-k dielectric layer thereunder. At operation 118, the second dipole pattern is removed. At operation 120, a third high-k dielectric layer is formed in the gate trenches over the second high-k dielectric layer and around the first and the second channel layers. At operation 122, a work function metal layer is formed over the third high-k dielectric layer to further tune the Vt's in the NFET and the PFET device regions. At operation 124, the method 100 performs further steps, such as forming a bulk metal layer and contacts. Additional processing is contemplated by the present disclosure. Additional steps can be provided before, during, and after the method 100, and some of the steps described can be moved, replaced, or eliminated for additional embodiments of the method 100. The discussion that follows illustrates various embodiments of CMOS integrated circuit devices that can be fabricated according to the method 100.

Figure 3A:
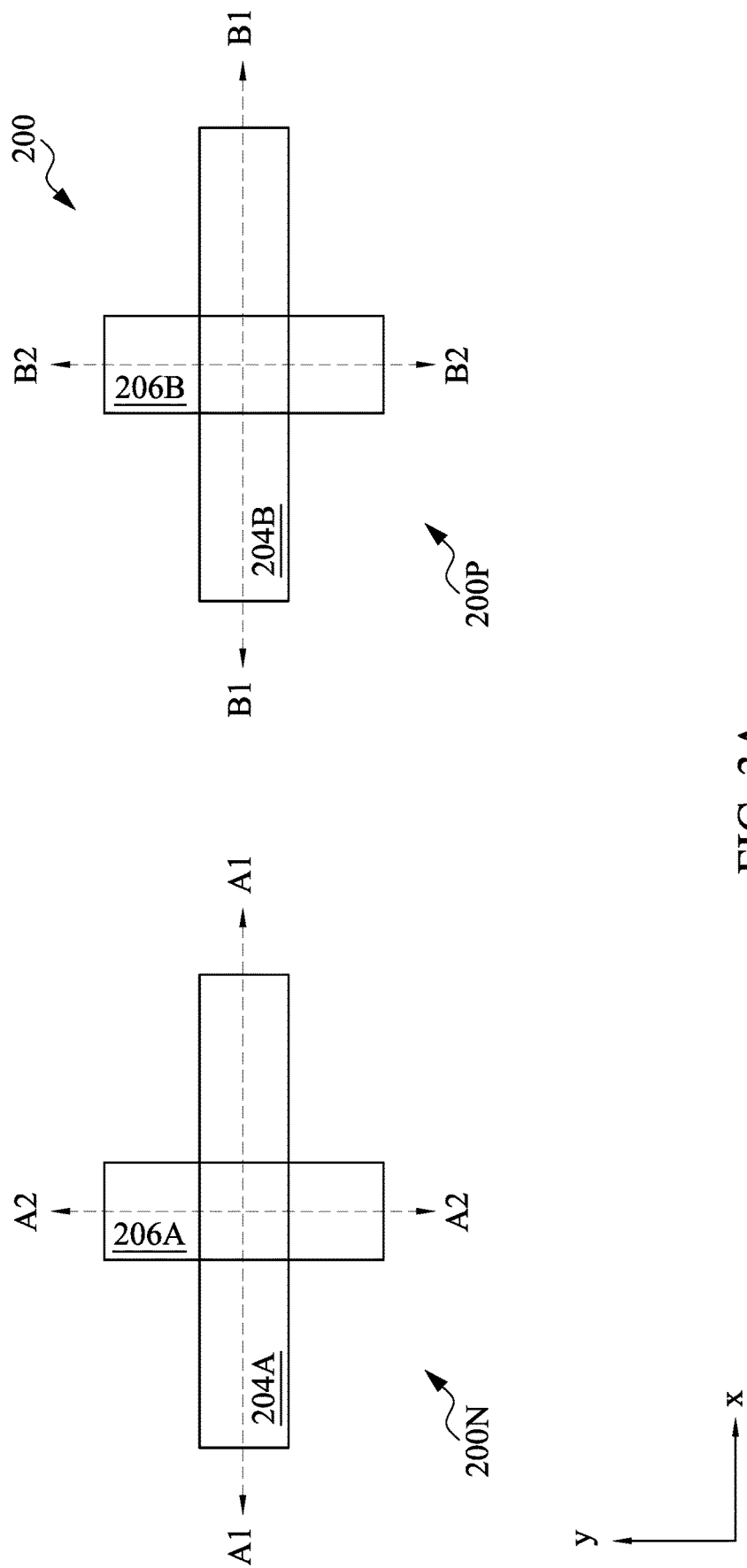
FIG. 3A is a diagrammatic top view of a CMOS device, in portion, according to various aspects of the present disclosure.

FIG. 3A is a diagrammatic top view of a CMOS device 200, in portion, at a fabrication stage associated with method 100 in FIG. 2 according to various aspects of the present disclosure. FIGS. 3B-19B are diagrammatic cross-sectional views of the device 200, in portion, at various fabrication stage associated with method 100 in FIG. 2 according to various aspects of the present disclosure.

The device 200 is a multi-gate (or multigate) device in the present embodiments, and may be included in a microprocessor, a memory, and/or other IC device. In some embodiments, the device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. In some embodiments, multi-gate device 200 is included in a non-volatile memory, such as a non-volatile random access memory (NVRAM), a flash memory, an electrically erasable programmable read only memory (EEPROM), an electrically programmable read-only memory (EPROM), other suitable memory type, or combinations thereof. FIGS. 3A-19B have been simplified for the sake of clarity to better understand the inventive concepts of the present disclosure. Additional features can be added in the device 200, and some of the features described below can be replaced, modified, or eliminated in other embodiments of the device 200. The fabrication of the device 200 is described below in conjunction with embodiments of the method 100.

Figure 3C:
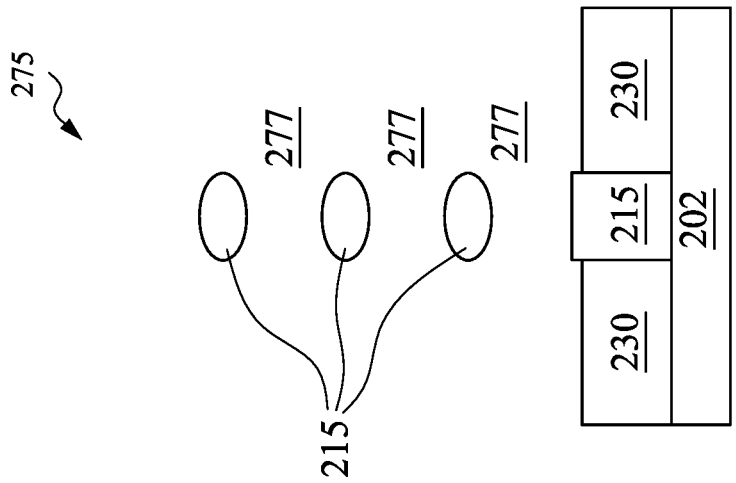
FIGS. 3B and 3C are diagrammatic cross-sectional views of the CMOS device in FIG. 3A, in portion, according to an embodiment of the present disclosure.
Figure 3B:
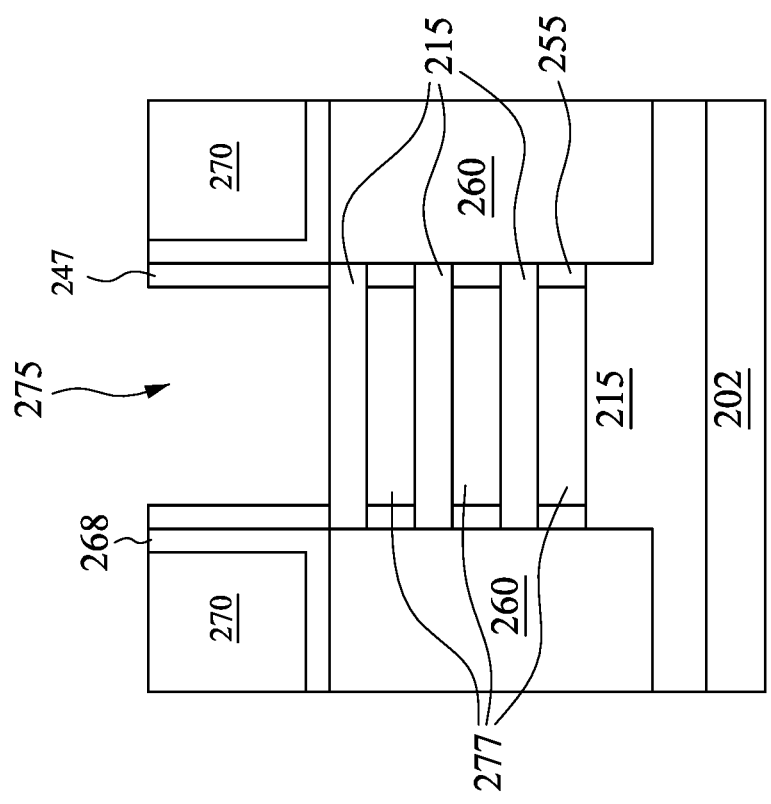

The method 100 (FIG. 2) provides an initial structure of the CMOS device 200 at the operation 102, a portion of which is shown in FIGS. 3A-3C. Particularly, FIG. 3A illustrates that the CMOS device 200 includes an NFET device 200N and a PFET device 200P at certain fabrication stage. The device 200N includes an active region 204A and a gate region 206A generally perpendicular to the active region 204A. The active region 204A includes a pair of source/drain regions and a channel region between the pair of source/drain regions, and the gate region 206A engages the channel region in the active region 204A. Similarly, the device 200P includes an active region 204B and a gate region 206B. The active region 204B includes a pair of source/drain regions and a channel region between the pair of source/drain regions, and the gate region 206B engages the channel region in the active region 204B.

FIG. 3B illustrate a cross-sectional view of the device 200 according to an embodiment, which can be a cross-sectional view of the device 200N or 200P along the A1-A1 or B1-B1 line of FIG. 3A, respectively. FIG. 3C illustrate a cross-sectional view of the device 200 according to an embodiment, which can be a cross-sectional view of the device 200N and 200P along the A2-A2 or B2-B2 line of FIG. 3A, respectively. The embodiments illustrated in FIGS. 3B and 3C are nanowire FETs, where their channel layers 215 are in the shape of nanowires. The devices 200N and 200P are illustrated as having the same configuration (for example, the same number of channel layers 215) for the sake of clarity to better understand the inventive concepts of the present disclosure. In various embodiments, the devices 200N and 200P can have different configurations. For example, they may have different number of channel layers 215 and/or their channel layers 215 can be of different shapes or dimensions. For another example, either or both of the devices 200N and 200P can be a FinFET, a nanowire FET, a nanosheet FET, or a planar FET.

Referring to FIGS. 3B-3C, the device 200 includes a substrate (e.g., a wafer) 202. In the depicted embodiment, substrate 202 includes silicon. Alternatively or additionally, substrate 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate.

Each of the transistors 200N and 200P further includes a pair of source/drain features 260. For the NFET 200N, the source/drain features 260 are of n-type. For the PFET 200P, the source/drain features 260 are of p-type. The source/drain features 260 may be formed by epitaxially growing semiconductor material(s) (e.g., Si or SiGe) to fill trenches in the device 200, for example, using CVD deposition techniques (e.g., Vapor Phase Epitaxy), molecular beam epitaxy, other suitable epitaxial growth processes, or combinations thereof. The source/drain features 260 are doped with proper n-type dopants and/or p-type dopants. For example, for the NFET 200N, the source/drain features 260 may include silicon and be doped with carbon, phosphorous, arsenic, other n-type dopant, or combinations thereof; and for the PFET 200P, the source/drain features 260 may include silicon germanium or germanium and be doped with boron, other p-type dopant, or combinations thereof.

Each of the transistors 200N and 200P further includes a stack of semiconductor layers 215 suspended over the substrate 202 and connecting the pair of the source/drain features 260. The stack of semiconductor layers 215 serve as the transistor channels for the respective transistor. Accordingly, the semiconductor layers 215 are also referred to as channel layers 215. The channel layers 215 are exposed in a gate trench 275 which is resulted from the removal of a dummy gate from the respective gate region 206A and 206B (FIG. 3A) therein. For the NFET 200N, the channel layers 215 may include single crystalline silicon or another suitable semiconductor material(s). For the PFET 200P, the channel layers 215 may comprise silicon, germanium, silicon germanium, or another suitable semiconductor material(s). Initially, the channel layers 215 are formed as part of a semiconductor layer stack that includes the channel layers 215 and other semiconductor layers of a different material. The semiconductor layer stack is patterned into a shape of a fin protruding above the substrate 202 using one or more photolithography processes, including double-patterning or multi-patterning processes. After the gate trenches 275 are formed, the semiconductor layer stack is selectively etched to remove the other semiconductor layers, leaving the channel layers 215 suspended over the substrate 202 and between the respective source/drain features 260. The channel layers 215 are separated from each other and from the substrate 202 by gaps 277.

In some embodiments, each channel layer 215 has nanometer-sized dimensions. For example, each channel layer 215 may have a length (along the "x" direction) about 10 nm to about 300 nm, and a width (along the "y" direction) about 10 nm to about 80 nm, and a height (along the "z" direction) about 4 nm to about 8 nm in some embodiments. The vertical spacing (along the "z" direction) between the channel layers 215 may be about 6 nm to about 15 nm in some embodiments. Thus, the channel layer 215 can be referred to as a "nanowire," which generally refers to a channel layer suspended in a manner that will allow a metal gate to physically contact at least two sides of the channel layer, and in GAA transistors, will allow the metal gate to physically contact at least four sides of the channel layer (i.e., surround the channel layer). In some embodiments, the channel layers 215 may be cylindrical-shaped (e.g., nanowire), rectangular-shaped (e.g., nanobar), sheet-shaped (e.g., nanosheet), or have other suitable shapes.

The device 200 further includes isolation feature(s) 230 to isolate various regions, such as the various active regions 204A and 204B. Isolation features 230 include silicon oxide, silicon nitride, silicon oxynitride, other suitable isolation material (for example, including silicon, oxygen, nitrogen, carbon, or other suitable isolation constituent), or combinations thereof. Isolation features 230 can include different structures, such as shallow trench isolation (STI) structures, deep trench isolation (DTI) structures, and/or local oxidation of silicon (LOCOS) structures. Isolation features 230 can include multiple layers of insulating materials.

The device 200 further includes gate spacers 247 adjacent to the source/drain features 260. The gate spacers 247 may include silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). In some embodiments, the gate spacers 247 include a multi-layer structure, such as a first dielectric layer that includes silicon nitride and a second dielectric layer that includes silicon oxide. The device 200 further includes inner spacers 255 vertically between adjacent channel layers 215 and adjacent to the source/drain features 260. Inner spacers 255 may include a dielectric material that includes silicon, oxygen, carbon, nitrogen, other suitable material, or combinations thereof (for example, silicon oxide, silicon nitride, silicon oxynitride, silicon carbide, or silicon oxycarbonitride). In some embodiments, inner spacers 255 include a low-k dielectric material. The gate spacers 247 and the inner spacers 255 are formed by deposition (e.g., CVD, PVD, ALD, etc.) and etching processes (e.g., dry etching). The gate trenches 275 are provided between opposing gate spacers 247 and opposing inner spacers 255.

The device 200 further includes a contact etch stop layer (CESL) 268 disposed over the isolation features 230, the epitaxial source/drain features 260, and the gate spacers 247. The CESL 268 includes silicon and nitrogen, such as silicon nitride or silicon oxynitride. The CESL 268 may be formed by a deposition process, such as CVD, or other suitable methods. The device 200 further includes an inter-layer dielectric (ILD) layer 270 over the CESL 268. The ILD layer 270 includes a dielectric material including, for example, silicon oxide, silicon nitride, silicon oxynitride, TEOS formed oxide, PSG, BPSG, low-k dielectric material, other suitable dielectric material, or combinations thereof. The ILD layer 270 may be formed by a deposition process, such as CVD, flowable CVD (FCVD), or other suitable methods.

Figure 3E:
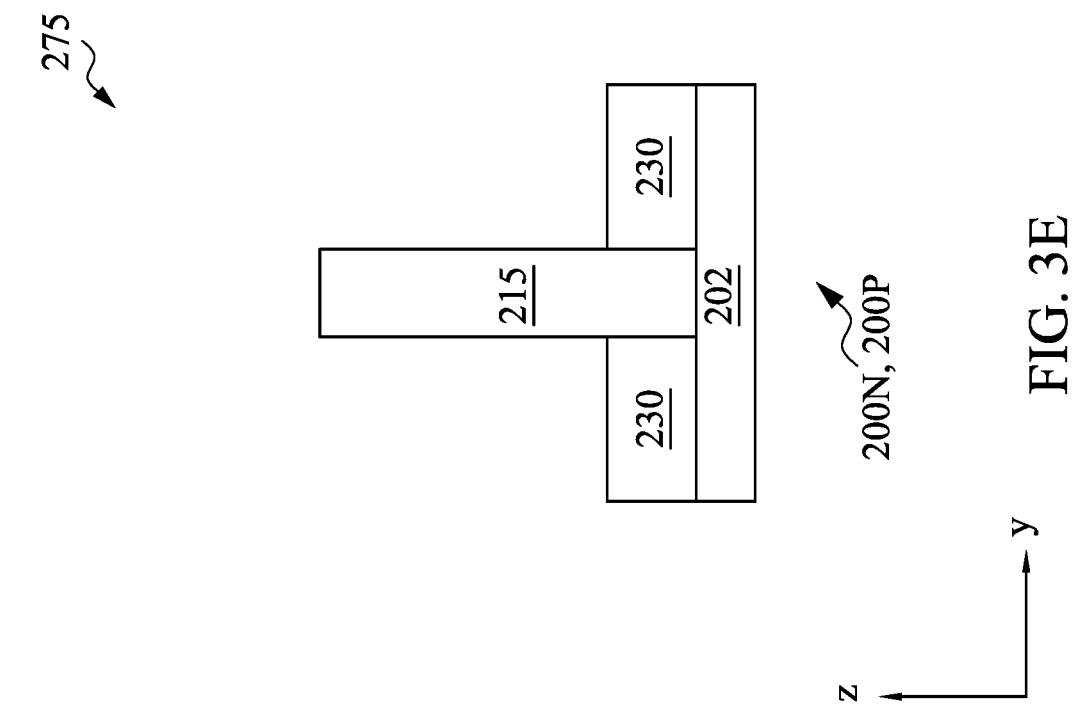
FIGS. 3D and 3E are diagrammatic cross-sectional views of the CMOS device in FIG. 3A, in portion, according to another embodiment of the present disclosure.
Figure 3D:
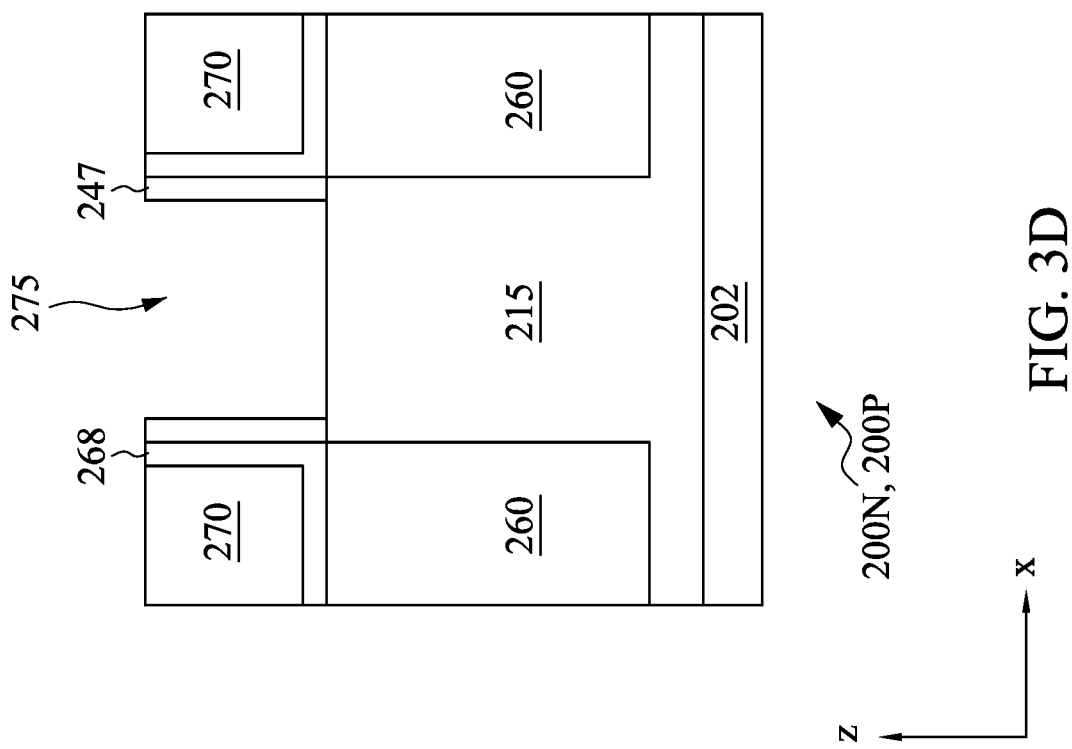

FIGS. 3D and 3E illustrate cross-sectional views of the device 200 according to another embodiment, where the channel layer 215 is in the shape of a fin rather than multiple stacked layers. Thus, it is also referred to as a fin 215, and the devices 200N and 200P as FinFETs. Particularly, FIG. 3D illustrates a cross-sectional view of the devices 200N and 200P along the A1-A1 and B1-B1 lines of FIG. 3A, and FIG. 3E illustrates a cross-sectional view of the devices 200N and 200P along the A2-A2 and B2-B2 lines of FIG. 3A. The fin 215 extends from the substrate 202 and through the isolation feature 230. The fin 215 connects the pair of source/drain features 260. The fin 215 may have a height (along the "z" direction) about 40 nm to about 70 nm and a width (along the "y" direction) about 4 nm to about 8 nm in some embodiments.

In the following discussion, the transistors 200N and 200P are nanowire FETs, such as illustrated in FIGS. 3B and 3C. However, they can also be FinFETs as illustrated in FIGS. 3D and 3E and the method 100 can be applied similarly to either embodiments, or to other types of transistors not illustrated in FIGS. 3B-3E.

Figure 4:
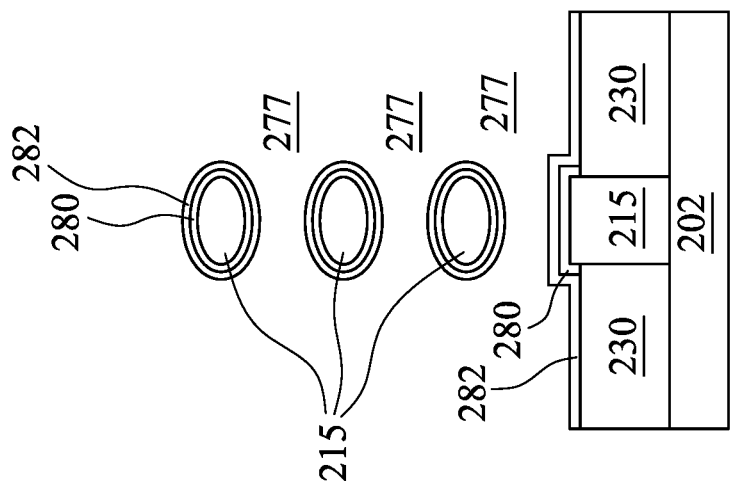
Figure 4:
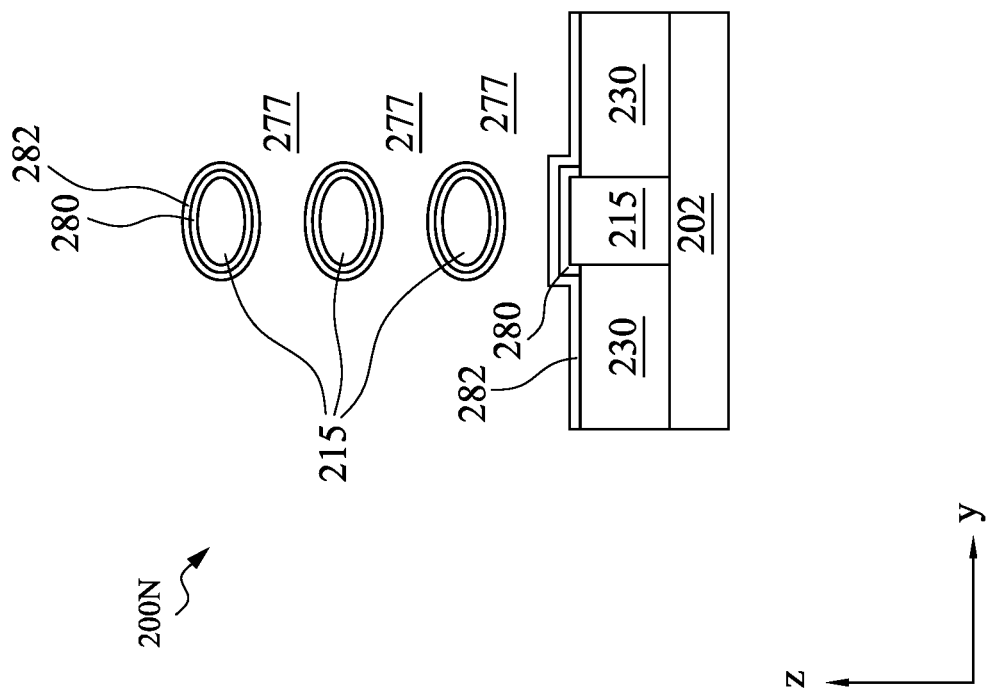

At the operation 104, the method 100 (FIG. 2) forms an interfacial layer 280 over the channel layers 215 and a high-k dielectric layer 282 over the interfacial layer 280, such as shown in FIG. 4, which illustrates cross-sectional views of the devices 200N and 200P along the A2-A2 and B2-B2 lines of FIG. 3A, respectively. Turning to FIG. 4, in the depicted embodiment, the interfacial layer 280 and the high-k dielectric layer 282 partially fill the gaps 277. In some embodiments, the interfacial layer 280 and/or the high-k dielectric layer 282 are also disposed on the substrate 202, the isolation features 230, and/or the gate spacers 247. The interfacial layer 280 includes a dielectric material, such as $SiO_2$, HfSiO, SiON, other silicon-containing dielectric material, other suitable dielectric material, or combinations thereof. The high-k dielectric layer 282 includes $HfO_2$ in the present embodiment. Alternatively, the high-k dielectric layer 282 includes another hafnium-containing high-k dielectric material, such as HfSiO, $HfSiO_4$, HfSiON, HfLaO, HfTaO, HfTiO, HfZrO, hafnium-aluminum-oxide (i.e., $HfAlO_x$), hafnium dioxide-alumina ($HfO_2$—$Al_2O_3$) alloy, or another high-k dielectric material such as $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, or combinations thereof. High-k dielectric material generally refers to dielectric materials having a high dielectric constant, for example, greater than 7.0. The interfacial layer 280 is formed by any of the processes described herein, such as thermal oxidation, chemical oxidation, ALD, CVD, other suitable process, or combinations thereof. In some embodiments, the interfacial layer 280 has a thickness of about 0.5 nm to about 1.5 nm. The high-k dielectric layer 282 is formed by any of the processes described herein, such as ALD, CVD, PVD, oxidation-based deposition process, other suitable process, or combinations thereof. In some embodiments, the high-k dielectric layer 282 has a thickness of about 0.2 nm to about 1.5 nm. In alternative embodiments, the interfacial layer 280 may be omitted in the devices 200N and 200P.

At operation 106, the method 100 (FIG. 2) forms a dipole pattern 410 over the high-k dielectric layer 282 in the transistor 200P and not over the high-k dielectric layer 282 in the transistor 200N (i.e., the high-k dielectric layer 282 in the transistor 200N is free from the dipole pattern 410). This may involve a variety of processes such as deposition, photolithography, and etching. An embodiment of the operation 106 is illustrated in FIGS. 5, 6, 7, and 8, which illustrate cross-sectional views of the devices 200N and 200P along the A2-A2 and B2-B2 lines of FIG. 3A, respectively, in various steps of the operation 106.

Figure 5:
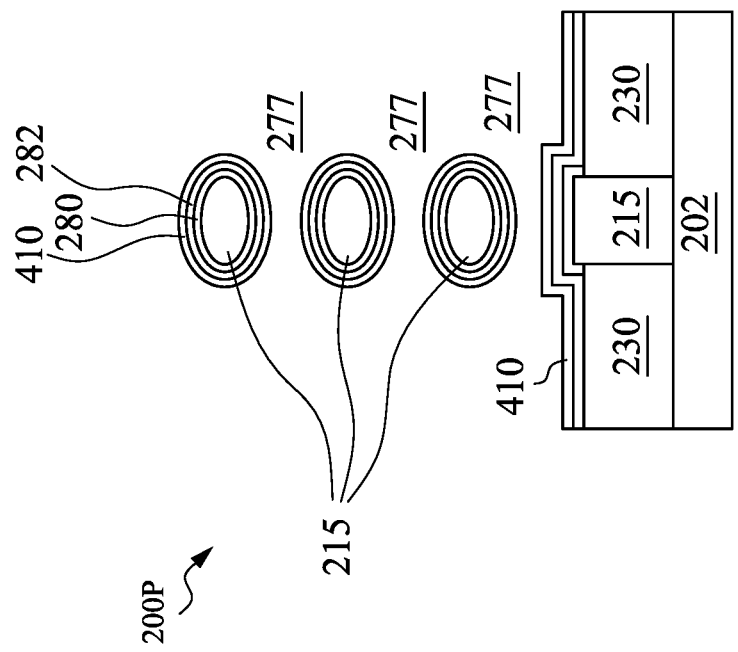
Figure 5:
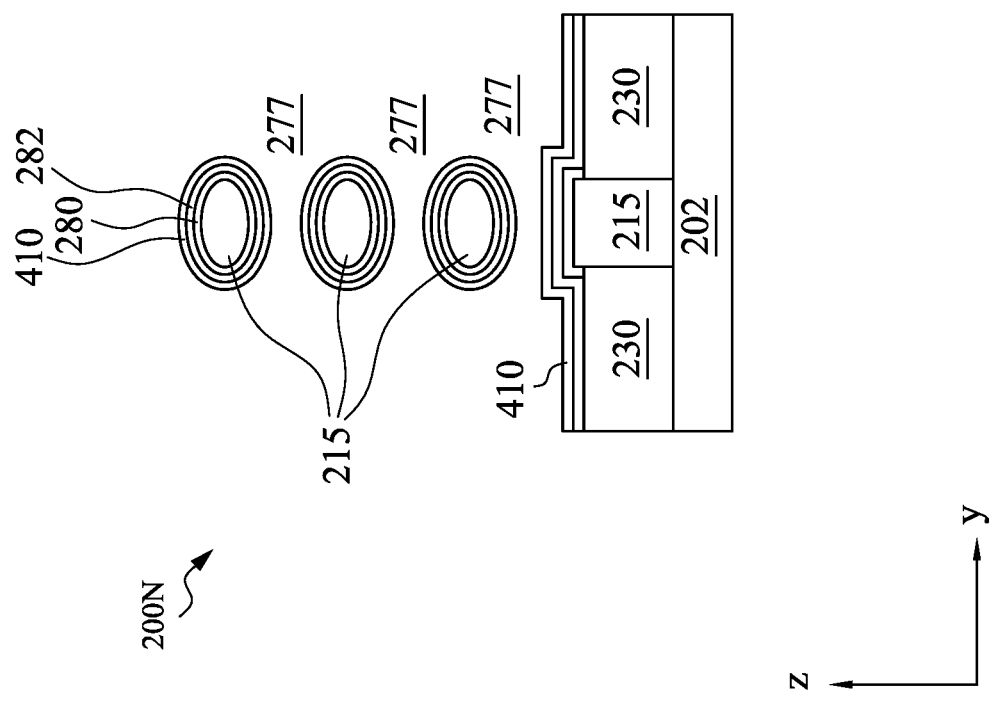

Turning to FIG. 5, the method 100 deposits a dipole layer 410 over the high-k dielectric layer 282 in the transistors 200N and 200P. The dipole layer 410 includes a dielectric material for dipole formation in the gate dielectric layer(s) of the transistor 200P. The dielectric material can be an oxide, a nitride, or another compound, with one or more dipole elements. The dipole elements can be driven into the high-k dielectric layer 282 from the dipole layer 410, for example, by an annealing process. In the present embodiment, the dipole elements are selected such that they reduce the threshold voltage of the transistor 200P. In other words, they shift the work function of the gate stack of the transistor 200P towards the valance band. In some embodiments, the dipole elements can be aluminum (Al), niobium (Nb), other suitable chemical elements, or a combination thereof. For example, the dipole layer 410 may include $Al_2O_3$, niobium oxide (e.g., $Nb_2O_5$), MN, NbN, or other suitable materials. In various embodiments, the dipole layer 410 may be deposited by ALD, CVD, or other suitable methods. Further, the dipole layer 410 is deposited to a substantially uniform thickness about 0.5 nm or less to about 3 nm in various embodiments. In the embodiment depicted in FIG. 5, the dipole layer 410 is deposited to surround each of the channel layers 215 that are suspended over the substrate 202 as well as over the surfaces of the channel layer 215 that is disposed on the substrate 202. In embodiments where the transistors 200N and 200P are FinFETs (see FIGS. 3D and 3E for an example), the dipole layer 410 is deposited over the top and sidewall surfaces of the fin 215.

Figure 6:
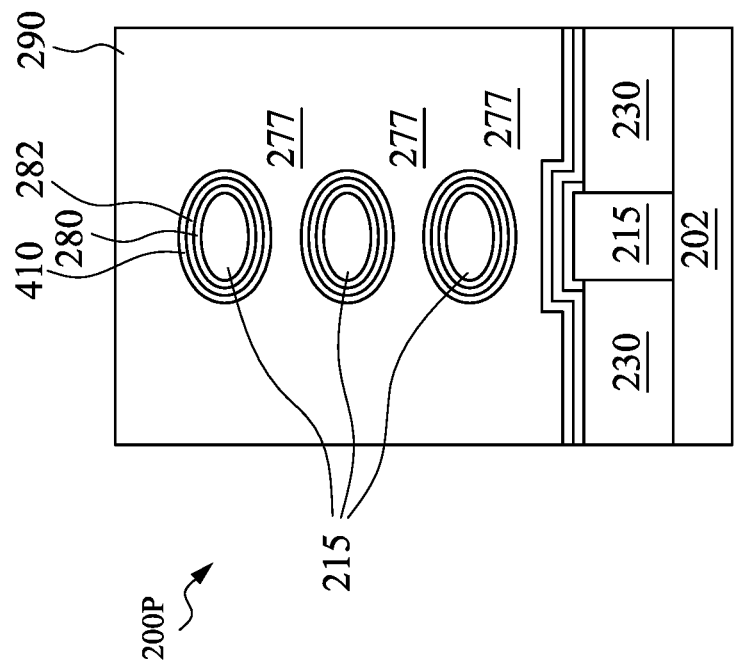
Figure 6:
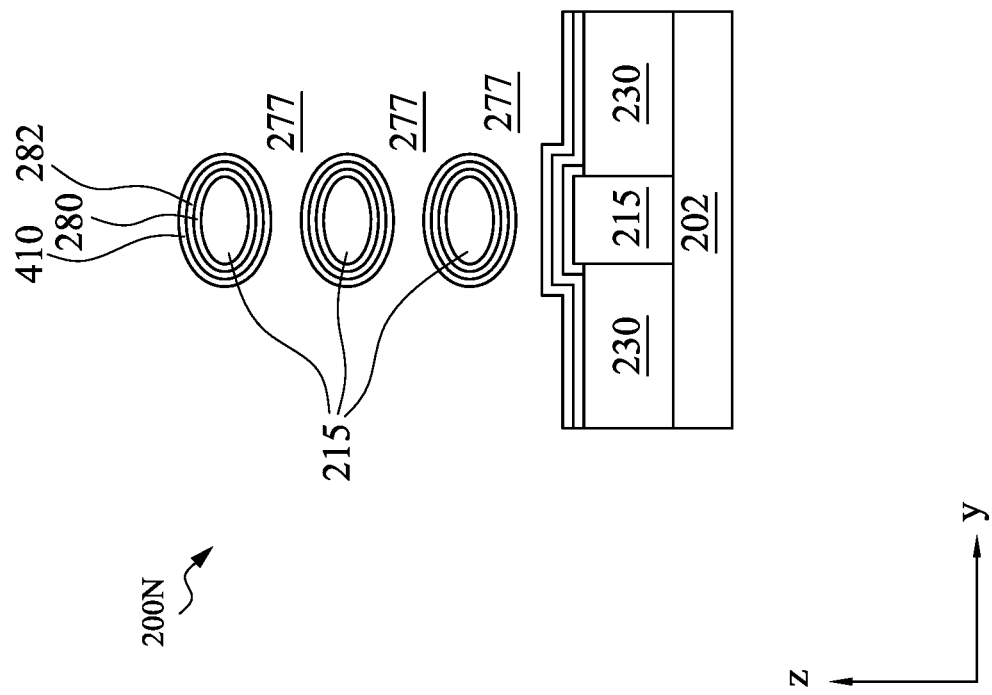

Turning to FIG. 6, the method 100 forms an etch mask 290 that covers the transistor 200P and exposes the transistors 200N. The mask 290 includes a material that is different than a material of the dipole layer 410 to achieve etching selectivity during the etching of the dipole layer 410. For example, the mask 290 may include a resist material (and thus may be referred to as a patterned resist layer and/or a patterned photoresist layer). In some embodiments, the mask 290 has a multi-layer structure, such as a resist layer disposed over an anti-reflective coating (ARC) layer. The present disclosure contemplates other materials for the mask 290, so long as etching selectivity is achieved during the etching of the dipole layer 410. In some embodiments, the operation 106 includes a lithography process that includes forming a resist layer over the device 200 (e.g., by spin coating), performing a pre-exposure baking process, performing an exposure process using a photomask, performing a post-exposure baking process, and developing the exposed resist layer in a developer solution. After development, the patterned resist layer (e.g., patterned mask 290) includes a resist pattern that corresponds with the photomask, where the patterned resist layer covers the transistor 200P and exposes the transistor 200N. Alternatively, the exposure process can be implemented or replaced by other methods, such as maskless lithography, e-beam writing, ion-beam writing, or combinations thereof.

Figure 7:
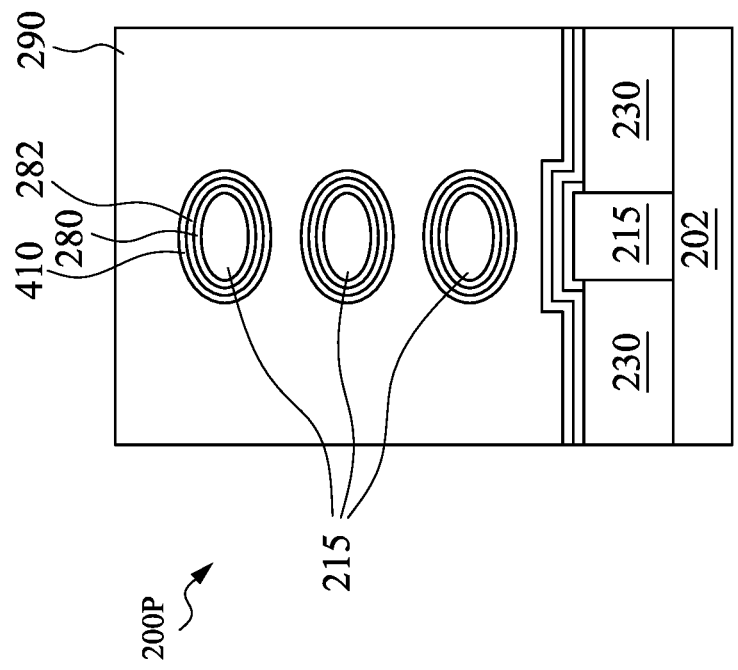
Figure 7:
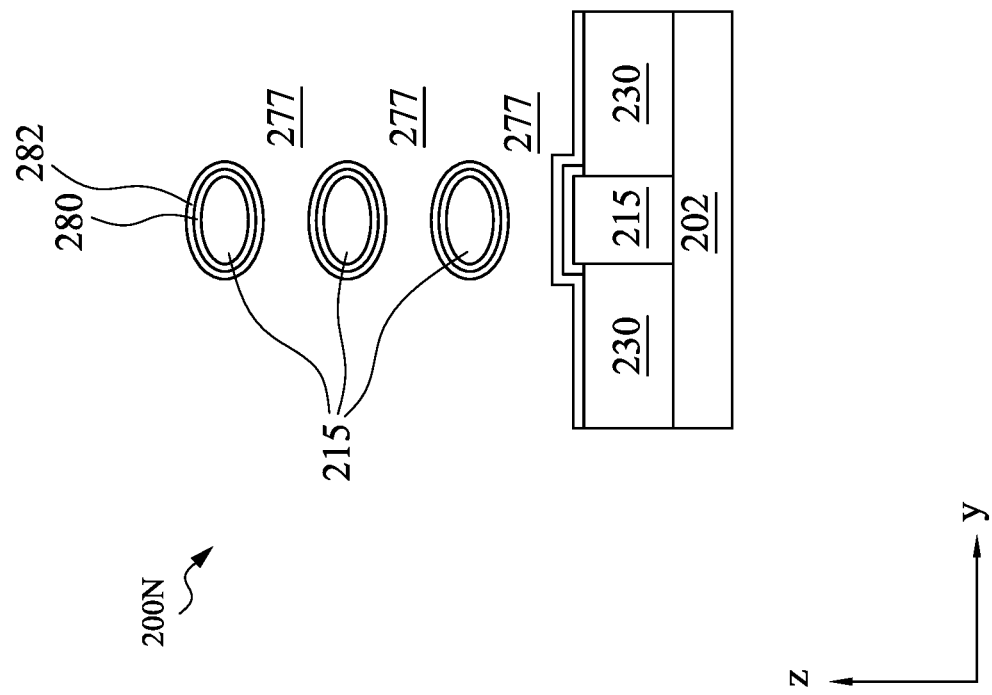

With the etch mask 290 in place, the operation 106 then etches the dipole layer 410 and removes it from the transistor 200N, such as shown in FIG. 7. The dipole layer 410 in the transistor 200P is protected by the etch mask 290 from the etching process. The etching process completely removes the dipole layer 410 around the channel layers 215 and between the channel layers 215 and the substrate 202 in the transistor 200N, thereby exposing the high-k dielectric layer 282 therein. The etching process can be a dry etching process, a wet etching process, or a reactive ion etching process that has a high etching selectivity with respect to the dipole layer 410 relative to the high-k dielectric layer 282. In some embodiments, the etching process is a wet etching process that uses an etching solution having a high etching selectivity with respect to the dipole layer 410 relative to the high-k dielectric layer 282. For example, the etching selectivity can be about 10 to about 100 or can be greater than 100. Parameters of the etching process (such as etching temperature, etching solution concentration, etching time, other suitable wet etching parameters, or combinations thereof) are controlled to ensure complete removal of the dipole layer 410 in the transistor 200N. For example, an etching time (i.e., how long the dipole layer 410 is exposed to a wet etching solution) is tuned to completely remove the dipole layer 410 with minimal (to no) etching of high-k dielectric layer 282. In some embodiments, the etching solution further has an etching selectivity with respect to dipole layer 410 relative to the mask 290. In some embodiments, the etching process partially etches the mask 290.

Figure 8:
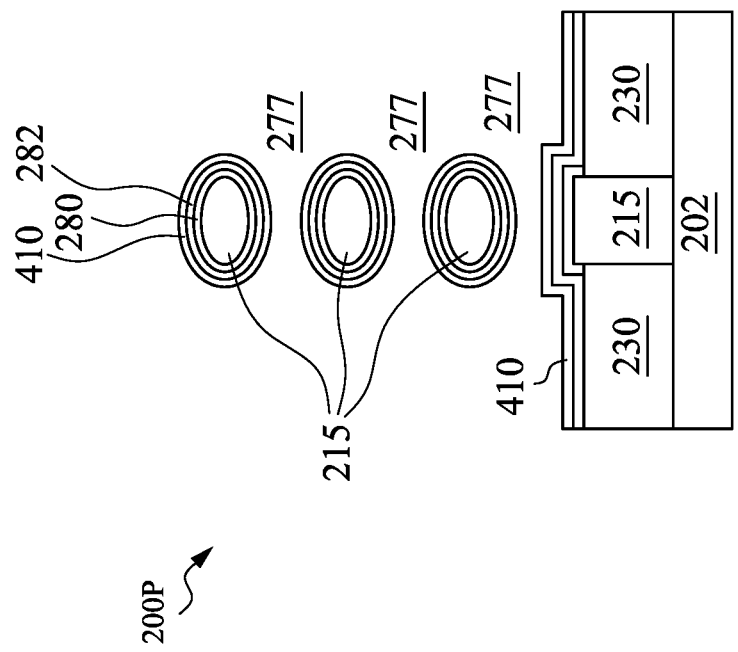
Figure 8:
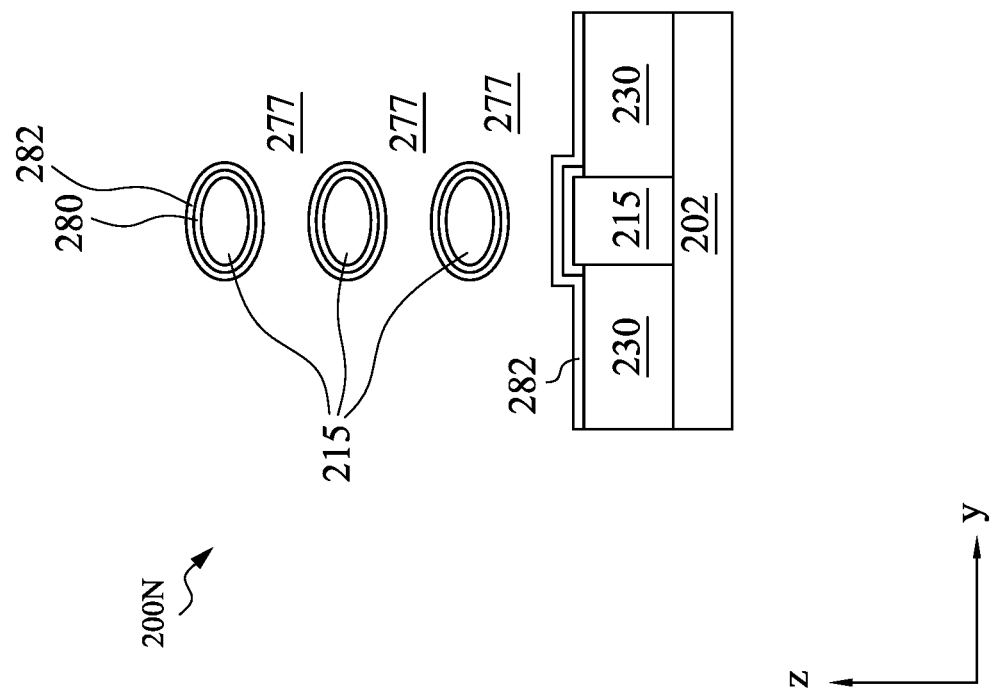

After the etching process completes, the mask 290 is removed, for example, by a resist stripping process or other suitable process at the operation 106 of the method 100 (FIG. 2). Turning to FIG. 8, only the portion of the dipole layer 410 in the transistor 200P still remains, which becomes a dipole pattern 410. The transistor 200N is free from the dipole pattern 410.

At operation 108, the method 100 (FIG. 2) performs a dipole drive-in process to the device 200 so that the dipole materials from the dipole pattern 410 are driven into the high-k dielectric layer 282 of the transistor 200P. In the present embodiment, the dipole drive-in process is an annealing process, such as rapid thermal annealing (RTA), millisecond annealing (MSA), microsecond annealing (OA), or other suitable annealing processes. In the present embodiment, the annealing temperature is controlled to be in a range about 500° C. to about 1100° C., such as from about 600° C. to about 800° C. The temperature is selected such that it does not adversely affect the existing structures and features of the device 200 and is yet sufficient to cause the dipole elements to migrate (or diffuse) from the dipole pattern 410 into the high-k dielectric layer 282 thereunder. In the present embodiment, the thickness of the interfacial layer 280 and the high-k dielectric layer 282 are designed so that the dipole materials can effectively permeate through these layers or at least through a majority of the high-k dielectric layer 282. For example, the interfacial layer 280 may have a thickness of about 0.2 nm to about 1.5 nm and the high-k dielectric layer 282 may have a thickness of about 0.2 nm to about 1.5 nm. After the dipole drive-in process completes, the high-k dielectric layer 282 in the transistor 200P becomes a high-k dielectric layer 282p (see FIG. 9), which is different from the high-k dielectric layer 282. In some embodiments, the dipole elements (such as Al or Nb) in the high-k dielectric layer 282p have a concentration of about 0.2% to about 30%. The specific concentration may be designed based on the desired shift in the gate work function. For example, a higher concentration of the dipole elements generally provides a larger upward shift in the gate work function of the device 200P. In various embodiments, incorporating the dipole elements into the high-k dielectric layer 282p can adjust the gate work function of the device 200P by up to 100 meV (meV stands for millielectronvolt), such as by about 50 meV to about 100 meV. Additionally, in some embodiments, the interfacial layer 280 in the transistor 200P becomes different from the interfacial layer 280 in the transistor 200N because it also incorporates some of the dipole materials.

Figure 9:
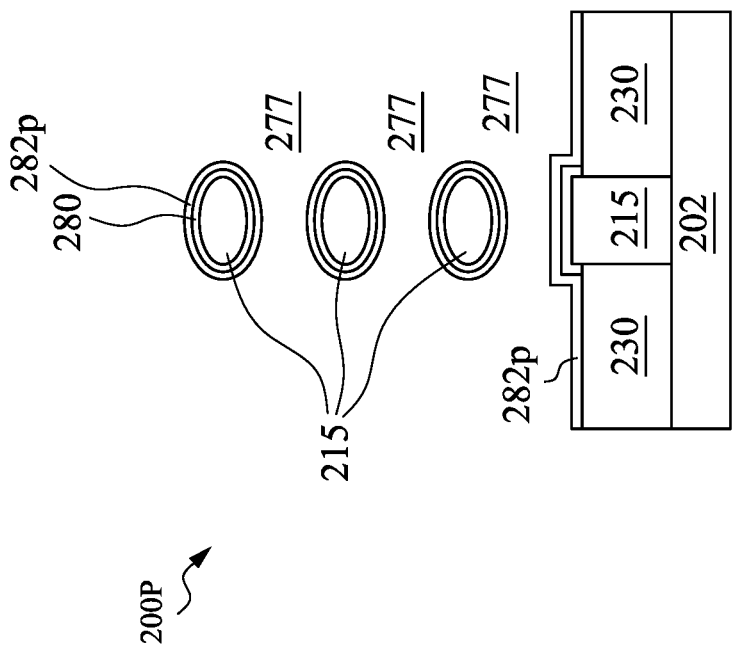
Figure 9:
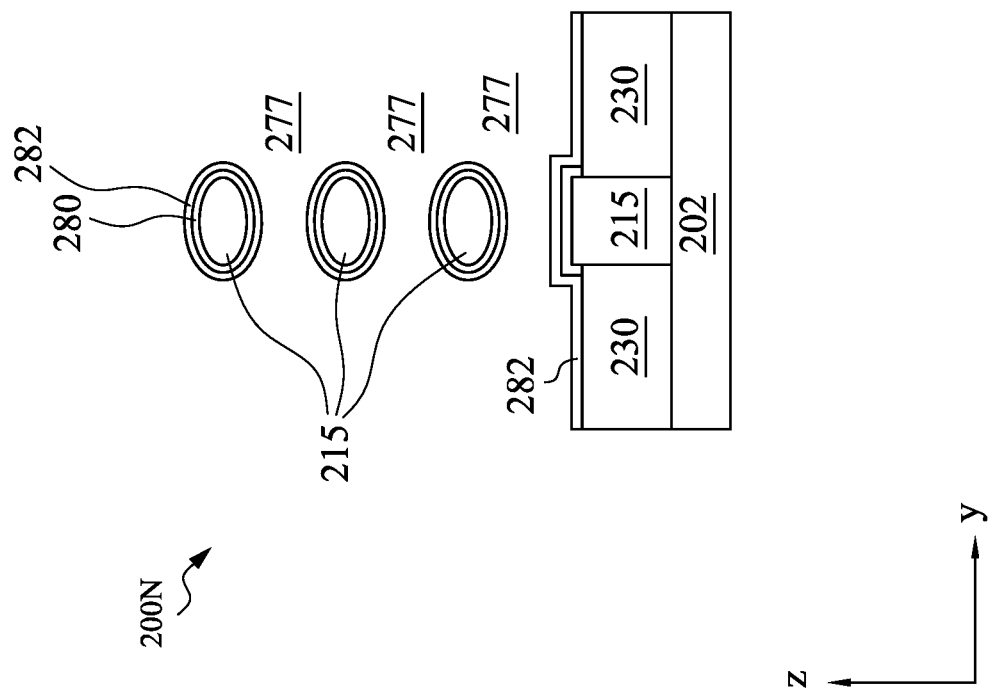

At operation 110, the method 100 (FIG. 2) removes the dipole pattern 410 from the device 200P by applying one or more etching processes. The resultant structure is shown in FIG. 9. The etching process can be a dry etching process, a wet etching process, a reactive ion etching process, or another etching process and has a high etching selectivity with respect to the dipole pattern 410 relative to the high-k dielectric layers 282 and 282p.

Figure 10:
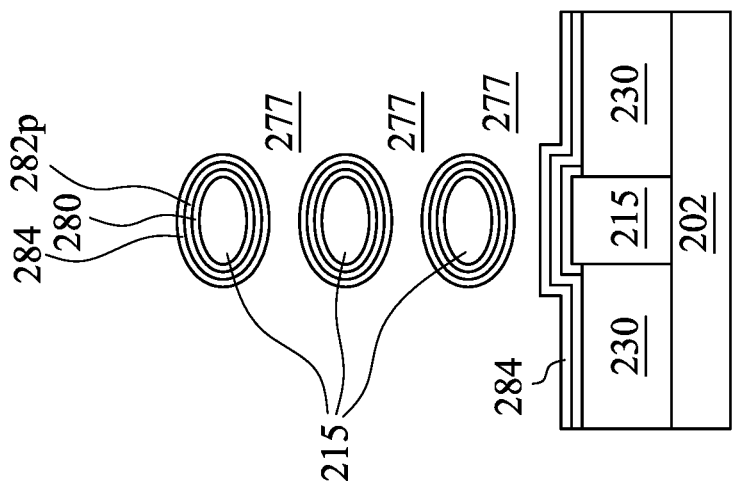
Figure 10:
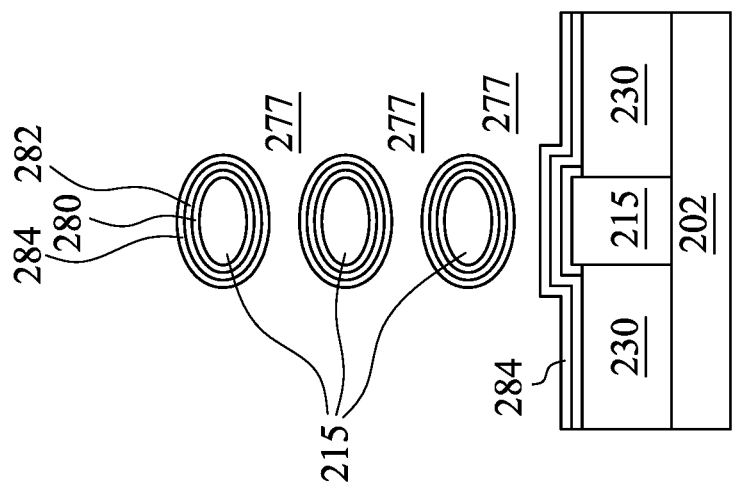

At operation 112, the method 100 (FIG. 2) forms a high-k dielectric layer 284 over the high-k dielectric layers 282 and 282p, such as shown in FIG. 10, which illustrates cross-sectional views of the devices 200N and 200P along the A2-A2 and B2-B2 lines of FIG. 3A, respectively. The layers 284, 282/282p, and 280 partially fill the gaps 277. In some embodiments, the high-k dielectric layer 284 is also disposed over the substrate 202, the isolation features 230, and/or the gate spacers 247. The high-k dielectric layer 284 includes $HfO_2$ in the present embodiment. Alternatively, the high-k dielectric layer 284 includes another hafnium-containing high-k dielectric material, such as HfSiO, $HfSiO_4$, HfSiON, HfLaO, HfTaO, HfTiO, HfZrO, hafnium-aluminum-oxide (i.e., $HfAlO_x$), hafnium dioxide-alumina ($HfO_2$—$Al_2O_3$) alloy, or another high-k dielectric material such as $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, or combinations thereof. The high-k dielectric layer 284 includes the same material as the high-k dielectric layer 282 in the present embodiment. Alternatively, the high-k dielectric layer 284 includes a different material than that in the high-k dielectric layer 282. The high-k dielectric layer 284 is formed by any of the processes described herein, such as ALD, CVD, PVD, oxidation-based deposition process, other suitable process, or combinations thereof. In some embodiments, the high-k dielectric layer 284 has a thickness of about 0.2 nm to about 1.5 nm.

At operation 114, the method 100 (FIG. 2) forms a dipole pattern 420 over the high-k dielectric layer 284 in the transistor 200N and not over the high-k dielectric layer 284 in the transistor 200P (i.e., the high-k dielectric layer 284 in the transistor 200P is free from the dipole pattern 420). Similar to the operation 106, the operation 114 may also involve a variety of processes such as deposition, photolithography, and etching. An embodiment of the operation 114 is illustrated in FIGS. 11, 12, 13, and 14, which illustrate cross-sectional views of the devices 200N and 200P along the A2-A2 and B2-B2 lines of FIG. 3A, respectively, in various steps of the operation 114. Many aspects of the operation 114 are similar to those of the operation 106 and will be briefly described below.

Figure 11:
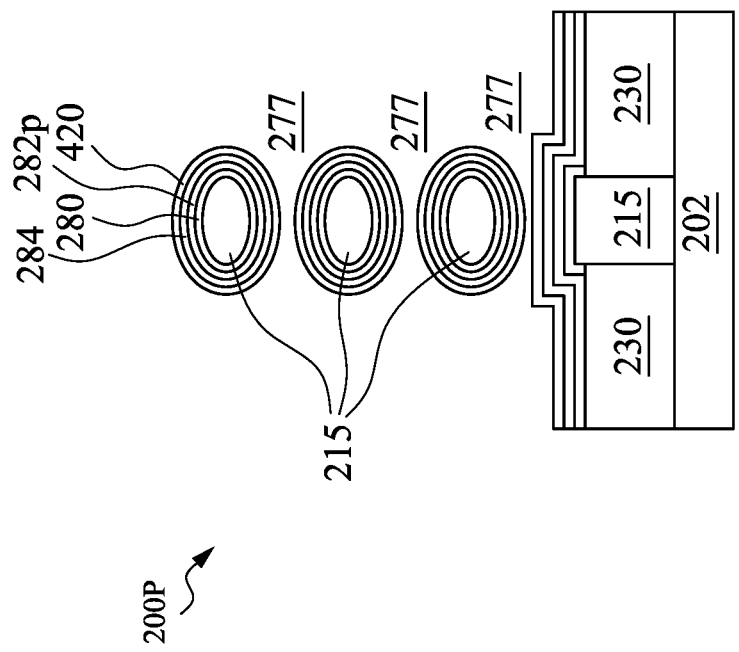
Figure 11:
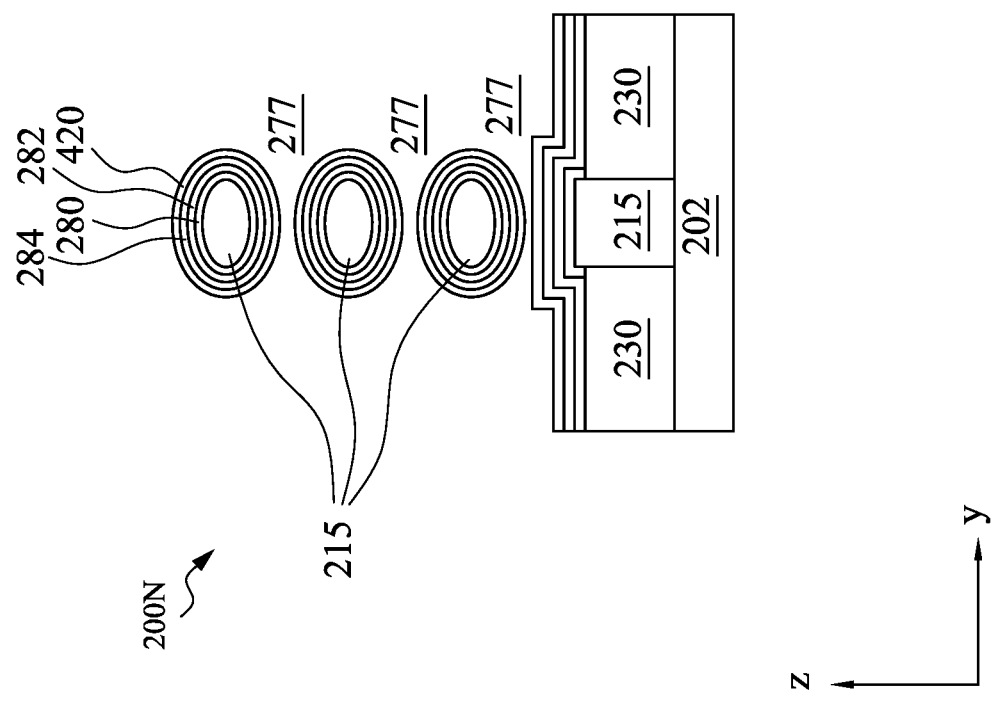

Turning to FIG. 11, the method 100 deposits a dipole layer 420 over the high-k dielectric layer 284 in the transistors 200N and 200P. The dipole layer 420 includes a dielectric material for dipole formation in the gate dielectric layer(s) of the transistor 200N. The dielectric material can be an oxide, a nitride, or another compound, with one or more dipole elements. The dipole elements can be driven into the high-k dielectric layer 284 from the dipole layer 420, for example, by an annealing process. In the present embodiment, the dipole elements are selected such that they reduce the threshold voltage of the transistor 200N. In other words, they shift the work function of the gate stack of the transistor 200N towards the conduction band. In an embodiment, the dipole elements may be lanthanum, yttrium, strontium, or some other chemical elements, and the dipole layer 420 may include an oxide or a nitride of the dipole elements. For example, the dipole layer 420 may include $La_2O_3$, $Y_2O_3$, SrO, LaN, YN, $Sr_3N_2$, or other suitable materials. In various embodiments, the dipole layer 420 may be deposited by ALD, CVD, or other suitable methods. Further, the dipole layer 420 is deposited to a substantially uniform thickness about 0.2 nm to about 1.5 nm in various embodiments. In the embodiment depicted in FIG. 11, the dipole layer 420 is deposited to surround each of the channel layers 215 that are suspended over the substrate 202 as well as over the surfaces of the channel layer 215 that is disposed on the substrate 202. In embodiments where the transistors 200N and 200P are FinFETs (see FIGS. 3D and 3E for an example), the dipole layer 420 is deposited over the top and sidewall surfaces of the channel layer 215.

Figure 12:
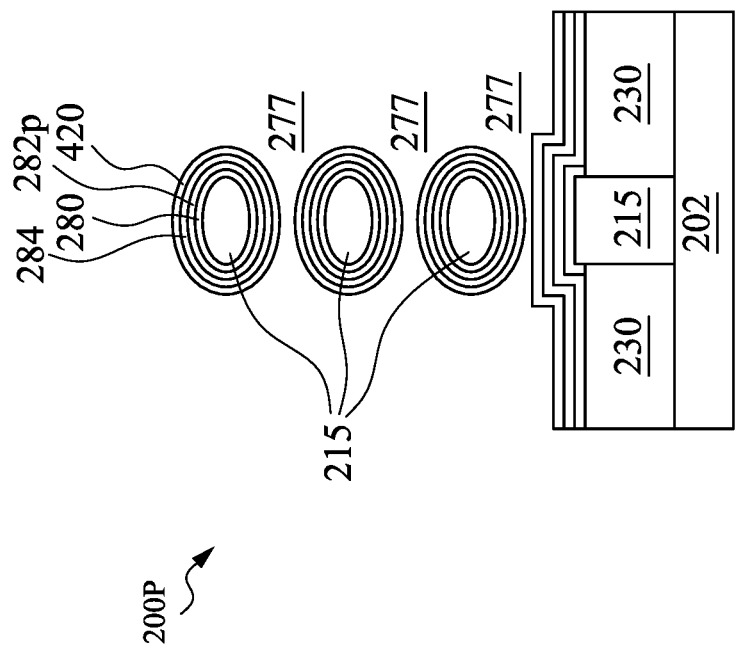
Figure 12:
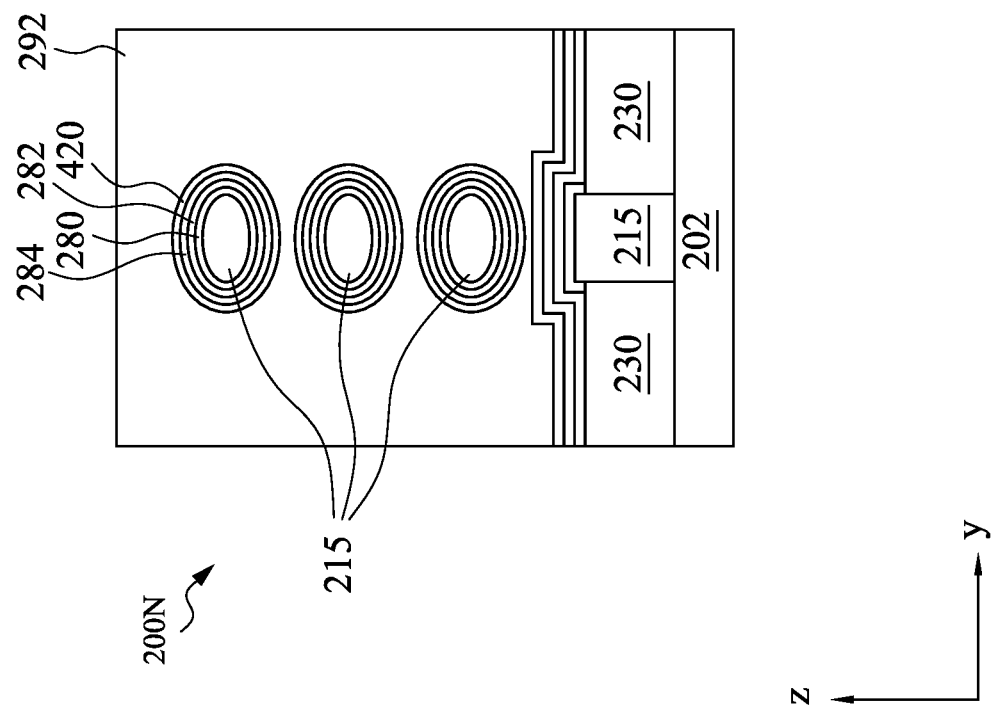

Turning to FIG. 12, the method 100 forms an etch mask 292 that covers the transistor 200N and exposes the transistor 200P. The mask 292 includes a material that is different than a material of the dipole layer 420 to achieve etching selectivity during the etching of the dipole layer 420. For example, the mask 292 may include a resist material or a resist layer disposed over an anti-reflective coating (ARC) layer. The operation 114 may use lithography and etching processes to create the mask 292, similar to the processes discussed with respect to the mask 290.

Figure 13:
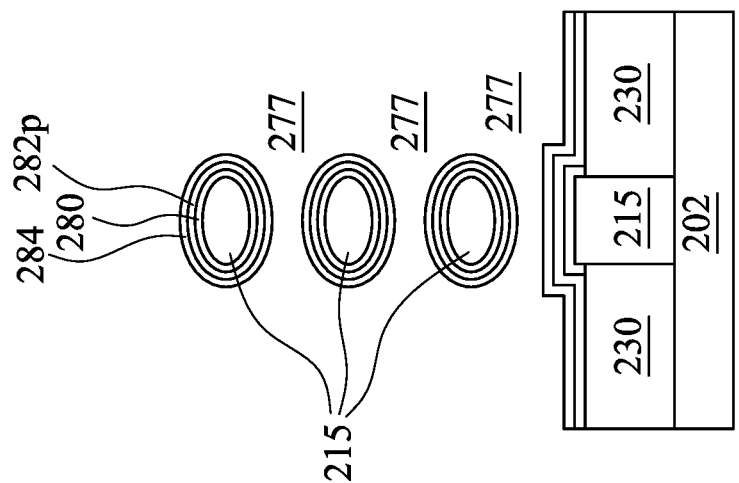
Figure 13:
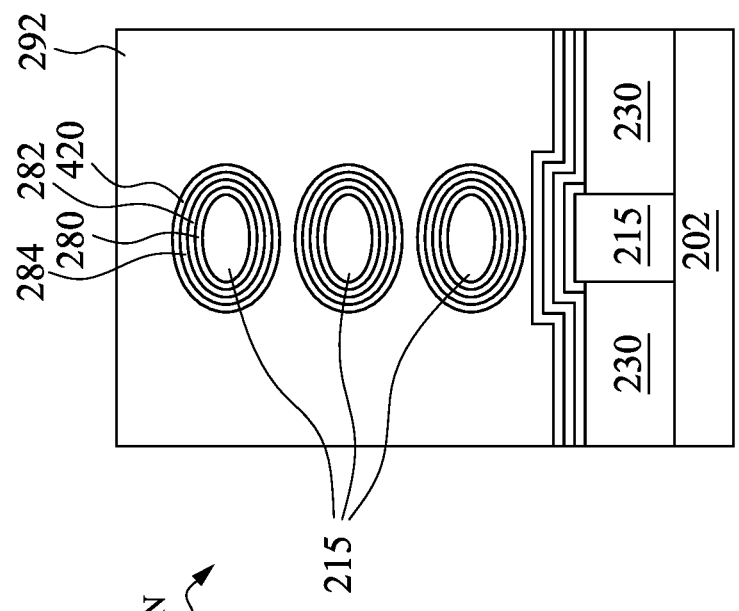

With the etch mask 292 in place, the operation 114 then etches the dipole layer 420 and removes it from the transistor 200P, such as shown in FIG. 13. The dipole layer 420 in the transistor 200N is protected by the etch mask 292 from the etching process. The etching process completely removes the dipole layer 420 around the channel layers 215 and between the channel layers 215 and the substrate 202 in the transistor 200P, thereby exposing the high-k dielectric layer 284 in the transistor 200P. The etching process can be a dry etching process, a wet etching process, or a reactive ion etching process that has a high etching selectivity with respect to the dipole layer 420 relative to the high-k dielectric layer 284. In some embodiments, the etching solution further has an etching selectivity with respect to dipole layer 420 relative to the mask 292. In some embodiments, the etching process partially etches the mask 292.

Figure 14:
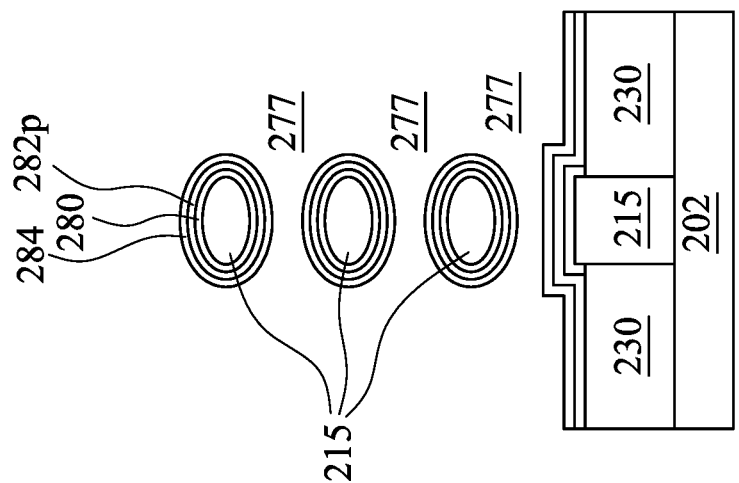
Figure 14:
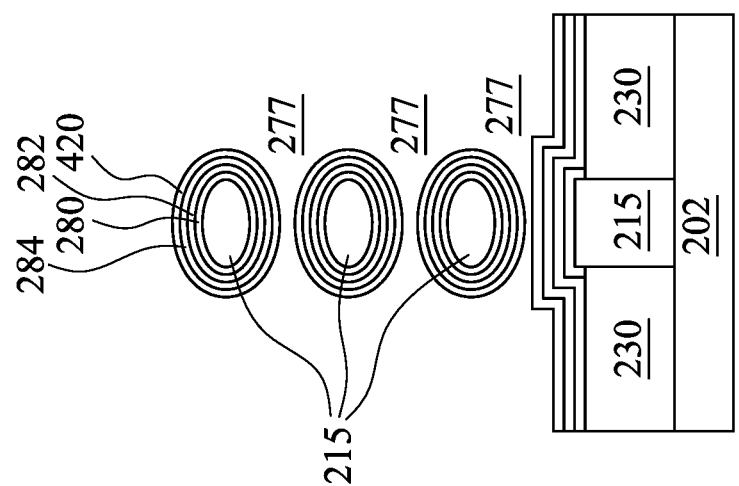
Figure 14:
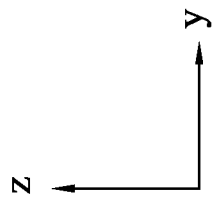

After the etching process completes, the mask 292 is removed, for example, by a resist stripping process or other suitable process at the operation 114 of the method 100 (FIG. 2). Turning to FIG. 14, only the portion of the dipole layer 420 in the transistor 200N still remains, which becomes a dipole pattern 420. The transistor 200P is free from the dipole pattern 420.

At operation 116, the method 100 (FIG. 2) performs a dipole drive-in process to the device 200 so that the dipole materials from the dipole pattern 420 are driven into the high-k dielectric layer 284 of the transistor 200N. In the present embodiment, the dipole drive-in process is an annealing process, such as rapid thermal annealing (RTA), millisecond annealing (MSA), microsecond annealing (OA), or other suitable annealing processes. In the present embodiment, the annealing temperature is controlled to be in a range about 500° C. to about 1100° C., such as from about 600° C. to about 800° C. The temperature is selected such that it does not adversely affect the existing structures and features of the device 200 and is yet sufficient to cause the dipole elements to migrate (or diffuse) from the dipole pattern 420 into the high-k dielectric layer 284 thereunder. In the present embodiment, the thickness of the interfacial layer 280 and the high-k dielectric layers 282 and 284 are designed so that the dipole materials can effectively permeate through these layers or at least through a majority of the high-k dielectric layer 284. For example, the interfacial layer 280 may have a thickness of about 0.2 nm to about 1.5 nm, the high-k dielectric layer 282 may have a thickness of about 0.2 nm to about 1.5 nm, and the high-k dielectric layer 284 may have a thickness of about 0.2 nm to about 1.5 nm. After the dipole drive-in process completes, the high-k dielectric layer 284 in the transistor 200N becomes a high-k dielectric layer 284n (see FIG. 15), which is different from the high-k dielectric layer 284. In some embodiments, the dipole elements (such as La, Y, or Sr) in the high-k dielectric layer 284n have a concentration of about 0.2% to about 30%. The specific concentration may be designed based on the desired shift in the gate work function. For example, a higher concentration of the dipole elements generally provides a larger downward shift in the gate work function of the device 200N. In various embodiments, incorporating the dipole elements into the high-k dielectric layer 284n can adjust the gate work function of the device 200N by up to 300 meV, such as by about 100 meV to about 300 meV.

Figure 15:
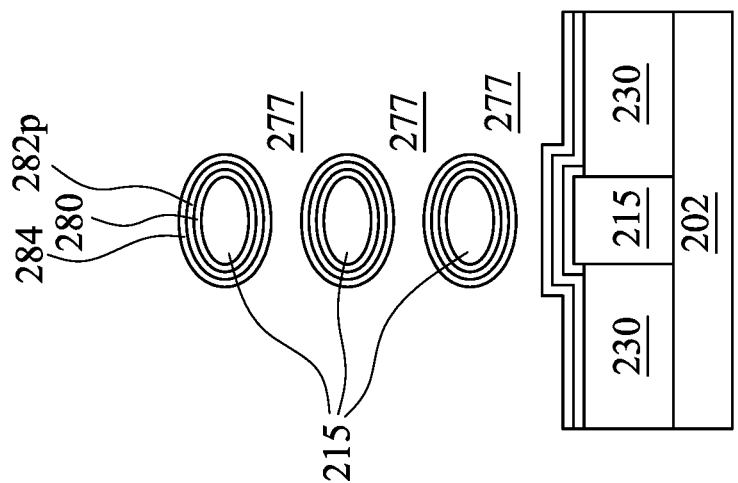
Figure 15:
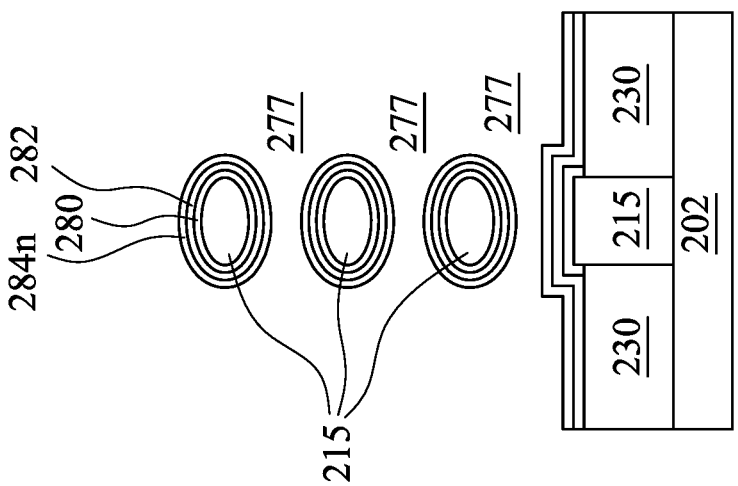

At operation 118, the method 100 (FIG. 2) removes the dipole pattern 420 from the device 200N by applying one or more etching processes. The resultant structure is shown in FIG. 15. The etching process can be a dry etching process, a wet etching process, a reactive ion etching process, or another etching process and has a high etching selectivity with respect to the dipole pattern 420 relative to the high-k dielectric layers 284 and 284n.

Figure 16:
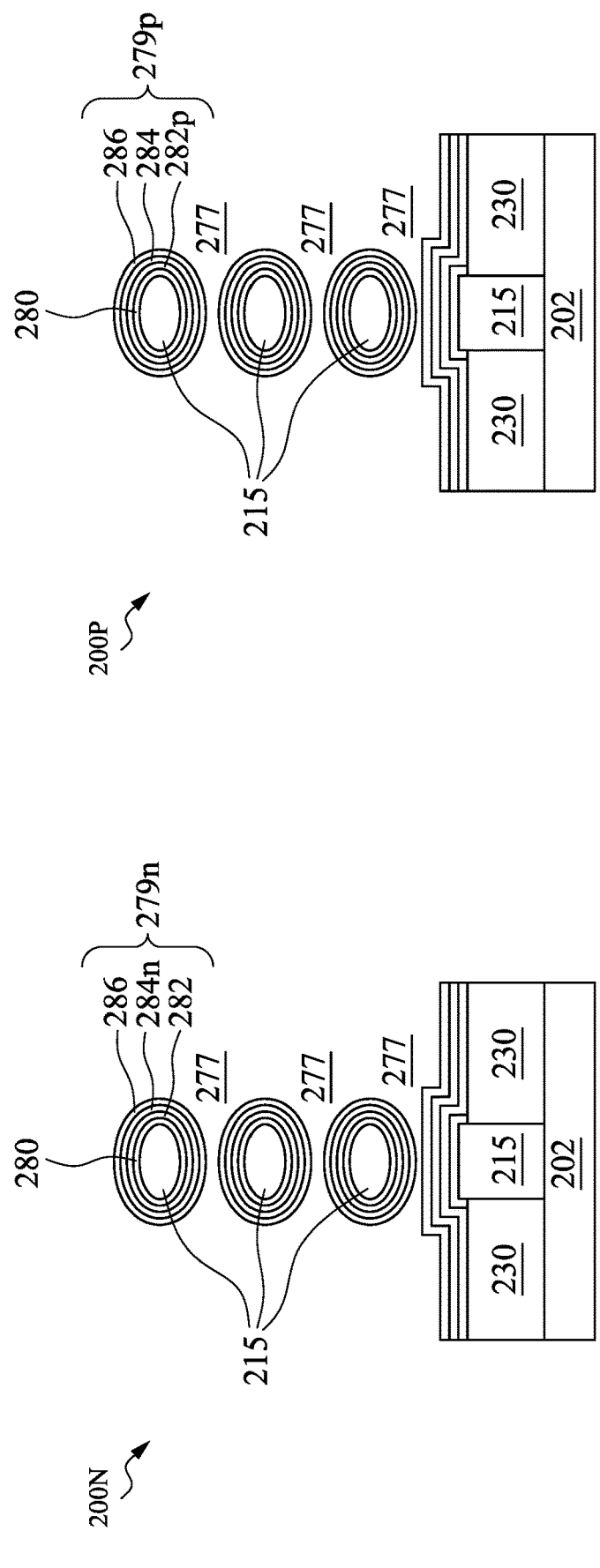

At operation 120, the method 100 (FIG. 2) forms a high-k dielectric layer 286 over the high-k dielectric layers 284 and 284n, such as shown in FIG. 16, which illustrates cross-sectional views of the devices 200N and 200P along the A2-A2 and B2-B2 lines of FIG. 3A, respectively. In the present embodiment, the layers 286, 284/284n, 282/282p, and 280 partially fill the gaps 277. In some embodiments, the high-k dielectric layer 286 is also disposed over the substrate 202, the isolation features 230, and/or the gate spacers 247. The high-k dielectric layer 286 includes $HfO_2$ in the present embodiment. Alternatively, the high-k dielectric layer 286 includes another hafnium-containing high-k dielectric material, such as HfSiO, $HfSiO_4$, HfSiON, HfLaO, HfTaO, HfTiO, HfZrO, hafnium-aluminum-oxide (i.e., $HfAlO_x$), hafnium dioxide-alumina ($HfO_2$—$Al_2O_3$) alloy, or another high-k dielectric material such as $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, or combinations thereof. In some embodiments, the high-k dielectric layers 282, 284, and 286 include the same material. For example, each of the layers 282, 284, and 286 includes $HfO_2$ in an embodiment. In an alternative embodiment, the high-k dielectric layers 282, 284, and 286 include different materials from each other. In yet another alternative embodiment, two of the high-k dielectric layers 282, 284, and 286 include the same material while the other high-k dielectric layer includes a different material. The high-k dielectric layer 286 is formed by any of the processes described herein, such as ALD, CVD, PVD, oxidation-based deposition process, other suitable process, or combinations thereof. In some embodiments, the high-k dielectric layer 286 has a thickness of about 0.2 nm to about 1.5 nm. The high-k dielectric layer 286 serves to prevent the dipole materials from the layers 284n and 282p from diffusing into a work function metal layer (see the layer 430 in FIG. 17) that is to be formed over the high-k dielectric layer 286. If the high-k dielectric layer 286 is too thin (such as less than 0.2 nm thick), then it might not prevent such diffusion effectively. If the high-k dielectric layer 286 is too thick (such as more than 1.5 nm thick), there might not be sufficient room left in the gate trench for forming gate metal layers such as gate work function metal layer(s).

As depicted in FIG. 16, a triple layer high-k stack 279n is thus formed in the NFET 200N, and a triple layer high-k stack 279p is thus formed in the PFET 200P. The triple layer high-k stack 279n includes the high-k dielectric layers 282, 284n, and 286. The triple layer high-k stack 279p includes the high-k dielectric layers 282p, 284, and 286. The thickness of the triple layer high-k stacks 279n and 279p are designed that they do not completely fill the gaps 277, leaving room for depositing gate work function metal layer(s) for the devices 200N and 200P.

Figure 17:
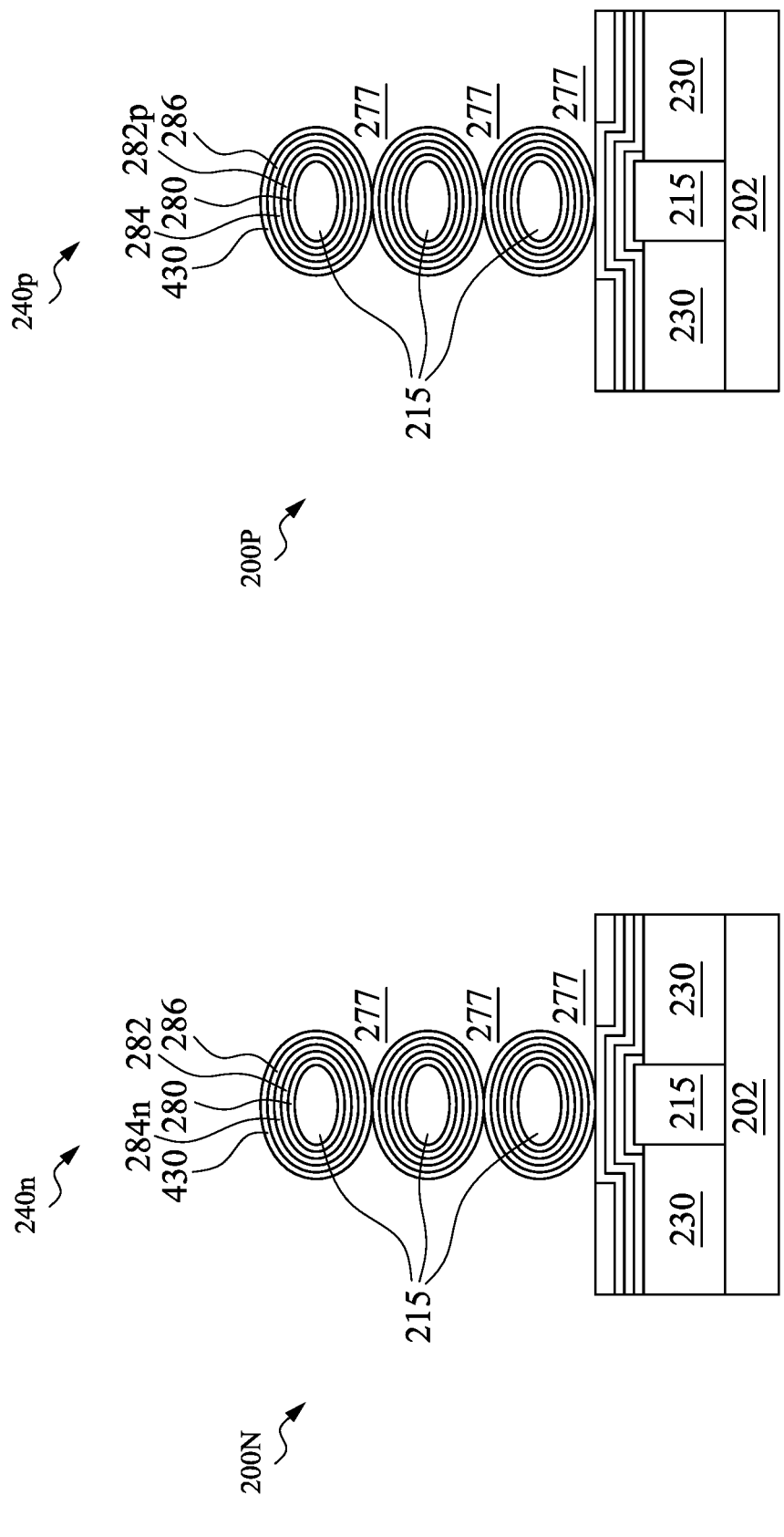

At operation 122, the method 100 (FIG. 2) forms a work function metal layer 430 over the devices 200N and 200P, such as shown in FIG. 17. The layers 280, 282, 284n, 286, and 430 form a part of the gate stack 240n for the NFET 200N. The layers 280, 282p, 284, 286, and 430 form a part of the gate stack 240p for the PFET 200P. The work function metal layer 430 is designed to provide a proper work function for the gate stacks 240n and 240p. In the present embodiment, the work function metal layer 430 is common to the transistors 200N and 200P, and the difference between the work functions of the gate stacks 240n and 240p is provided by the triple layer high-k stacks 279n and 279p. For example, as discussed above, the triple layer high-k stack 279p adjusts the work function of the gate stack 240p upwards from that of the work function metal layer 430, while the triple layer high-k stack 279n adjusts the work function of the gate stack 240n downwards from that of the work function metal layer 430. Having a common work function metal layer 430 allows the gate stacks 240n and 240p to be made sufficiently thin to fill in the gate trenches 275 (see FIGS. 3B and 3C), and particularly fill in the gaps 277. The layers 280, 282, 284n, 286, and 430 partially or fully fill the gaps 277 in the NFET 200N in some embodiments. The layers 280, 282p, 284, 286, and 430 partially or fully fill the gaps 277 in the PFET 200P in some embodiments. Depending on design objectives, the work function metal layer 430 may include any suitable work function metal(s), such as Ti, Al, Ag, Mn, Zr, TiC, TiAl, TiAlC, TiAlSiC, TaC, TaCN, TaSiN, TaAl, TaAlC, TaSiAlC, TiAlN, TiN, TaN, TaSN, Ru, Mo, Al, WN, WCN $ZrSi_2$, $MoSi_2$, $TaSi_2$, $NiSi_2$, or combinations thereof. In some embodiments, the work function metal layer 430 has a thickness of about 1 nm to about 5 nm. The work function metal layer 430 may be formed by any suitable deposition processes such as CVD, PVD, and/or ALD. In an alternative embodiment, the work function metal layer 430 may be formed differently for the NFET 200N and for the PFET 200P. For example, the work function metal layer 430 for the NFET 200N may include an n-type work function metal, such as Ti, Al, Ag, Mn, Zr, TiC, TiAl, TiAlC, TiAlSiC, TaC, TaCN, TaSiN, TaAl, TaAlC, TaSiAlC, TiAlN, other n-type work function material, or combinations thereof; while the work function metal layer 430 for the PFET 200P may include a p-type work function metal, such as TiN, TaN, TaSN, Ru, Mo, Al, WN, WCN $ZrSi_2$, $MoSi_2$, $TaSi_2$, $NiSi_2$, other p-type work function material, or combinations thereof. To further such alternative embodiment, the work function metal layer 430 for the NFET 200N and the PFET 200P may be formed by deposition and patterning processes.

Figure 18A:
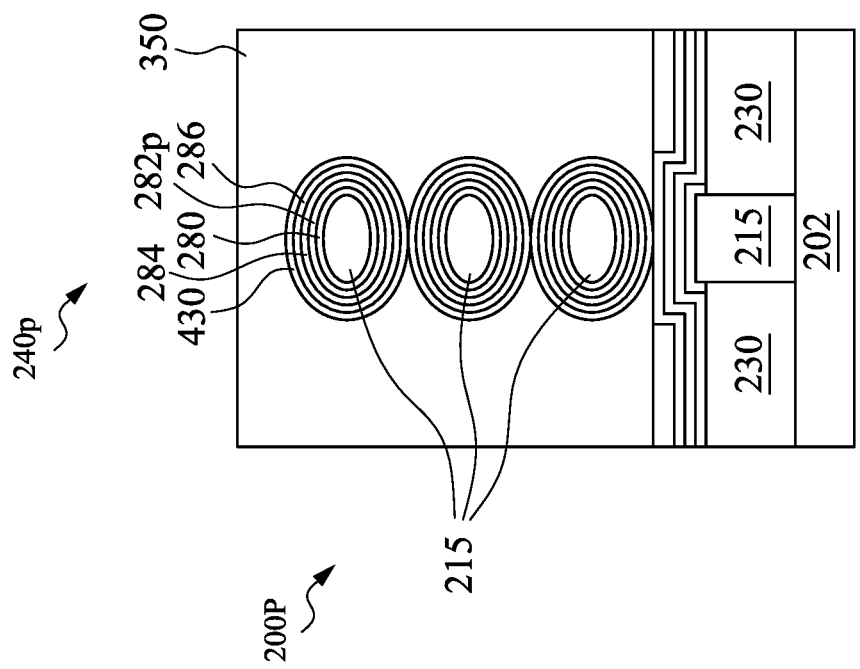
Figure 18A:
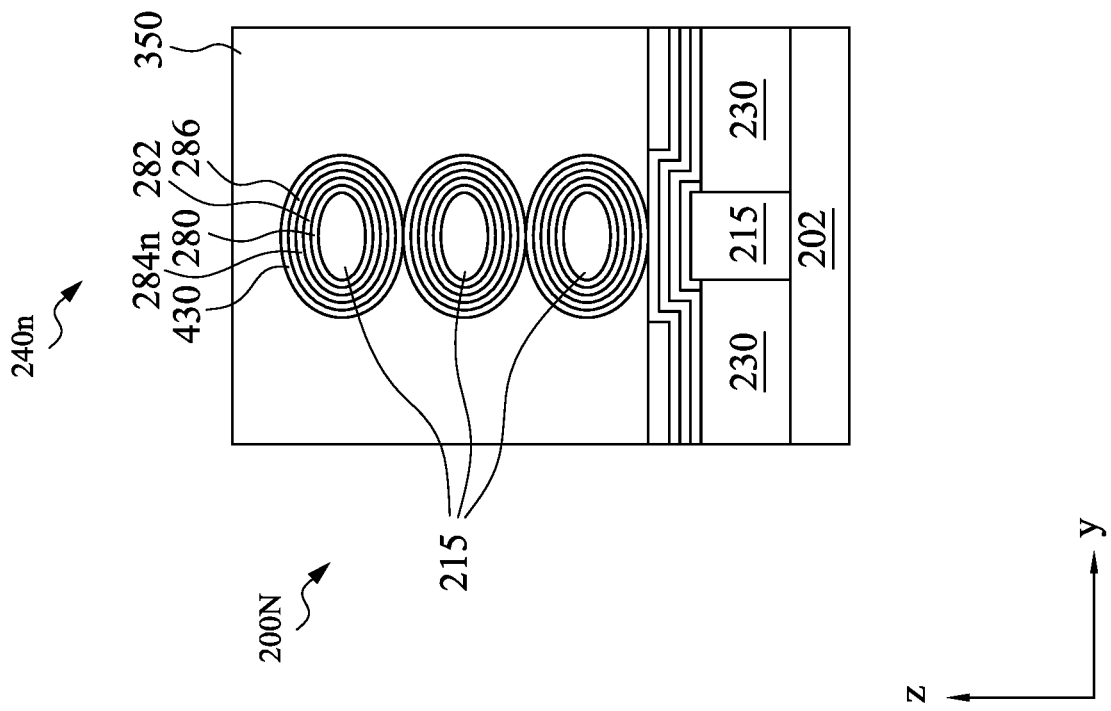
Figure 18B:
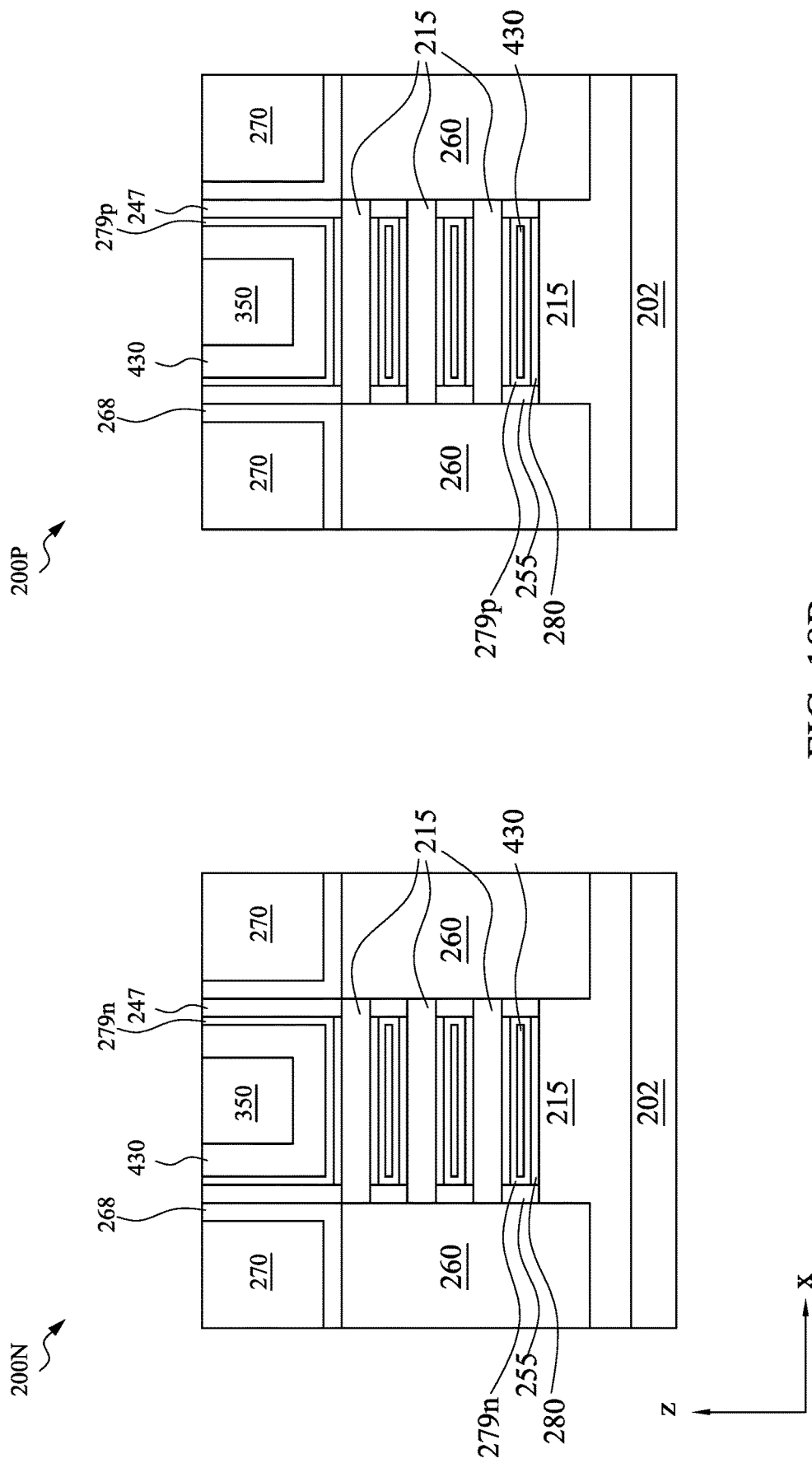
Figure 18C:
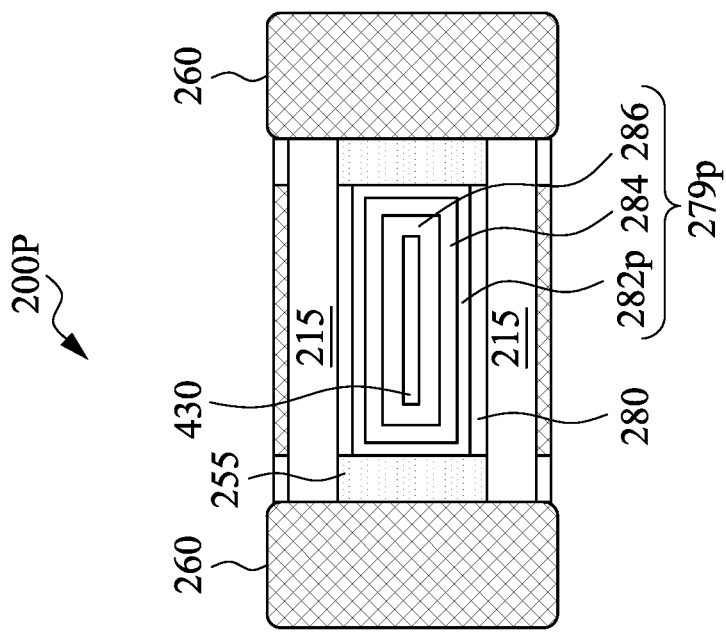
Figure 18C:
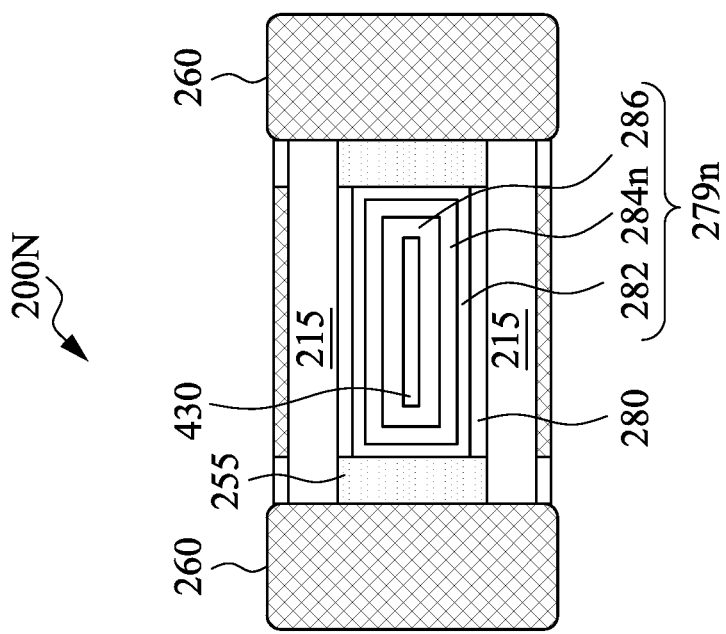

At operation 124, the method 100 (FIG. 2) performs further fabrication to the device 200. For example, it may form a bulk metal layer 350 over the work function metal layer 430, such as shown in FIGS. 18A and 18B. FIG. 18A illustrates the transistors 200N and 200P along the A2-A2 and B2-B2 lines of FIG. 3A, respectively, at this fabrication stage; and FIG. 18B illustrates the transistors 200N and 200P along the A1-A1 and B1-B1 lines of FIG. 3A, respectively, at this fabrication stage. FIG. 18C illustrates an enlarged view of a portion of the transistors 200N and 200P of FIG. 18B. For example, a CVD process or a PVD process deposits the bulk metal layer 350, such that it fills any remaining portion of gate trenches 275 (see FIGS. 3B and 3C). The bulk metal layer 350 includes a suitable conductive material, such as Al, W, and/or Cu. The bulk metal layer 350 may additionally or collectively include other metals, metal oxides, metal nitrides, other suitable materials, or combinations thereof. In some implementations, a blocking layer (not shown) is optionally formed (e.g., by ALD) over the work function metal layer 430 before forming the bulk metal layer 350, such that the bulk metal layer 350 is disposed on the blocking layer. After the bulk metal layer 350 is deposited, a planarization process may then be performed to remove excess gate materials from the device 200. For example, a CMP process is performed until a top surface of ILD layer 270 is reached (exposed). The method 100 may perform other operations such as forming S/D contacts that electrically connect to the S/D features 260, forming gate vias that electrically connect to the bulk metal layer 350, and forming multi-layer interconnects that connect the transistors 200N and 200P to various parts of the device 200 to form a complete IC.

FIGS. 19A and 19B illustrate the transistors 200N and 200P, in portion, in an alternative embodiment where the transistors 200N and 200P are FinFETs. FIG. 19A illustrates the FinFET 200N and 200P along the A1-A1 and B1-B1 lines of FIG. 3A, respectively, and FIG. 19B illustrates the FinFETs 200N and 200P along the A2-A2 and B2-B2 lines of FIG. 3A, respectively. As illustrated, the interfacial layer 280, the triple layer high-k stack 279n (for 200N) or 279p (for 200P), and the work function metal layer 430 are disposed over the top and sidewalls of the fin 215.

Although not intended to be limiting, one or more embodiments of the present disclosure provide many benefits to a semiconductor device and the formation thereof. For example, embodiments of the present disclosure provide triple layer high-k dielectric stacks for simultaneously tuning the work function of NFET and PFET. The triple layer high-k dielectric stacks utilize dipole materials for adjusting the work function of respective gate stacks. The work function of NFET can be adjusted by up to 300 meV in some instances, and the work function of PFET can be adjusted by up to 100 meV in some instances. The disclosed triple layer high-k dielectric stacks protect the gate work function metal layer(s) from being affected by dipole materials in the triple layer high-k dielectric stacks. The present embodiments can be readily integrated into existing CMOS fabrication processes.

In one example aspect, the present disclosure is directed to a method that includes providing a structure having a substrate, a first channel layer in an NMOS region, and a second channel layer in a PMOS region. The method further includes depositing a first layer comprising hafnium oxide over both the first and the second channel layers; forming a first dipole pattern over the second channel layer and not over the first channel layer, wherein the first dipole pattern includes a first metal; annealing the structure such that the first metal is driven into the first layer under the first dipole pattern; and removing the first dipole pattern. After removing the first dipole pattern, the method further includes depositing a second layer comprising hafnium oxide over the first layer and over both the first and the second channel layers; forming a second dipole pattern over the second layer and over the first channel layer and not over the second channel layer, wherein the second dipole pattern includes a second metal; annealing the structure such that the second metal is driven into the second layer under the second dipole pattern; and removing the second dipole pattern. After removing the second dipole pattern, the method further includes depositing a third layer comprising hafnium oxide over the second layer and over both the first and the second channel layers.

In an embodiment, the method further includes depositing a work function metal layer over the third layer and over both the first and the second channel layers. In some embodiments, the forming of the first dipole pattern includes depositing a first dipole layer over both the first and the second channel layers wherein the first dipole layer includes the first metal; and patterning the first dipole layer into the first dipole pattern using photolithography and etching processes.

In some embodiments, the forming of the second dipole pattern includes depositing a second dipole layer over both the first and the second channel layers wherein the second dipole layer includes the second metal; and patterning the second dipole layer into the second dipole pattern using photolithography and etching processes.

In an embodiment of the method, the first metal includes aluminum or niobium. In another embodiment, the second metal includes lanthanum, yttrium, or strontium. In some embodiments, each of the first, the second, and the third layers has a thickness in a range of about 2 Å to 15 Å. In some embodiments, after the first metal is driven into the first layer, a concentration of the first metal in a portion of the first layer over the second channel layer is in a range of about 0.2% to about 30%. In some embodiments, after the second metal is driven into the second layer, a concentration of the second metal in a portion of the second layer over the first channel layer is in a range of about 0.2% to about 30%. In some embodiments, the first channel layer includes silicon and the second channel layer includes silicon or silicon germanium.

In another example aspect, the present disclosure is directed to a semiconductor structure that includes a substrate; a first channel layer over the substrate in an NFET region; a second channel layer over the substrate in a PFET region; and a first gate dielectric layer over both the first and the second channel layers. A first portion of the first gate dielectric layer is disposed over the first channel layer and includes hafnium oxide. A second portion of the first gate dielectric layer is disposed over the second channel layer and includes a compound of hafnium oxide and a first metal, wherein the first metal includes aluminum or niobium. The semiconductor structure further includes a second gate dielectric layer over the first gate dielectric layer and over both the first and the second channel layers. A first portion of the second gate dielectric layer is disposed over the first channel layer and includes a compound of hafnium oxide and a second metal. A second portion of the second gate dielectric layer is disposed over the second channel layer and includes hafnium oxide, wherein the second metal includes lanthanum, yttrium, or strontium. The semiconductor structure further includes a third gate dielectric layer over the second gate dielectric layer and over both the first and the second channel layers, wherein the third gate dielectric layer includes hafnium oxide.

In an embodiment, the semiconductor structure further includes a gate work function metal layer over the third gate dielectric layer and over both the first and the second channel layers. In some embodiments of the semiconductor structure, each of the first, the second, and the third gate dielectric layers has a thickness in a range of about 2 Å to 15 Å. In some embodiments, a concentration of the first metal in the second portion of the first gate dielectric layer is in a range of about 0.2% to about 30%. In some embodiments, a concentration of the second metal in the first portion of the second gate dielectric layer is in a range of about 0.2% to about 30%. In some embodiments, the first channel layer includes silicon and the second channel layer includes silicon or silicon germanium.

In yet another example aspect, the present disclosure is directed to a semiconductor structure that includes a substrate; a first channel layer over the substrate in an NFET region; a second channel layer over the substrate in a PFET region; an interfacial layer over both the first and the second channel layers; and a first gate dielectric layer over the interfacial layer, wherein a first portion of the first gate dielectric layer is disposed over the first channel layer and includes hafnium oxide, and a second portion of the first gate dielectric layer is disposed over the second channel layer and includes a compound of hafnium oxide and a first metal. The semiconductor structure further includes a second gate dielectric layer over the first gate dielectric layer, wherein a first portion of the second gate dielectric layer is disposed over the first channel layer and includes a compound of hafnium oxide and a second metal, and a second portion of the second gate dielectric layer is disposed over the second channel layer and includes hafnium oxide. The semiconductor structure further includes a third gate dielectric layer over the second gate dielectric layer and over both the first and the second channel layers, wherein the third gate dielectric layer comprises hafnium oxide. The semiconductor structure further includes a gate work function metal layer over the third gate dielectric layer and over both the first and the second channel layers.

In an embodiment of the semiconductor structure, the first metal includes aluminum or niobium, and the second metal includes lanthanum, yttrium, or strontium. In another embodiment, a concentration of the first metal in the second portion of the first gate dielectric layer is in a range of about 0.2% to about 30%. In yet another embodiment, a concentration of the second metal in the first portion of the second gate dielectric layer is in a range of about 0.2% to about 30%.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate;
   a first stack of channel layers over the substrate in an NFET region;
   a second stack of channel layers over the substrate in a PFET region;
   a first gate dielectric layer surrounding each layer of the first and the second stacks of channel layers, wherein a first portion of the first gate dielectric layer is disposed over each of the first stacks of channel layers and includes hafnium oxide, and a second portion of the first gate dielectric layer is disposed over each of the second stacks of channel layers and includes a compound of hafnium oxide and a first metal, wherein the first metal includes niobium, wherein the first and the second portions of the first gate dielectric layer include different materials;
   a second gate dielectric layer over the first gate dielectric layer and surrounding each layer of the first and the second stacks of channel layers, wherein a first portion of the second gate dielectric layer is disposed over each of the first stacks of channel layers and includes a compound of hafnium oxide and a second metal, and a second portion of the second gate dielectric layer is disposed over each of the second stacks of channel layers and includes hafnium oxide, wherein the second metal includes yttrium, wherein the first and the second portions of the second gate dielectric layer include different materials; and
   a third gate dielectric layer over the second gate dielectric layer and surrounding each layer of the first and the second stacks of channel layers, wherein the third gate dielectric layer includes hafnium oxide, wherein respective portions of the third gate dielectric layer on each layer of the first stack of channel layers are spaced from each other, and respective portions of the third gate dielectric layer on each layer of the second stack of channel layers are spaced from each other.

2. The semiconductor structure of claim 1, further comprising:
a gate work function metal layer over the third gate dielectric layer and surrounding each layer of the first and the second stacks of channel layers.

3. The semiconductor structure of claim 1, wherein each of the first, the second, and the third gate dielectric layers has a thickness in a range of about 2 Angstroms (Å) to 15 Å.

4. The semiconductor structure of claim 1, wherein a concentration of the first metal in the second portion of the first gate dielectric layer is in a range of about 0.2% to about 30%.

5. The semiconductor structure of claim 1, wherein a concentration of the second metal in the first portion of the second gate dielectric layer is in a range of about 0.2% to about 30%.

6. The semiconductor structure of claim 1, wherein the first stack of channel layers includes silicon and the second stack of channel layers includes silicon or silicon germanium.

7. A semiconductor structure, comprising:
a substrate;
a first stack of channel layers over the substrate in an NFET region;
a second stack of channel layers over the substrate in a PFET region;
an interfacial layer surrounding each layer of the first and the second stacks of channel layers;
a first gate dielectric layer over the interfacial layer, wherein a first portion of the first gate dielectric layer surrounds each of the first stack of channel layers and includes hafnium oxide, and a second portion of the first gate dielectric layer surrounds each of the second stack of channel layers and includes a compound of hafnium oxide and a first metal, wherein the first metal includes niobium, wherein the first and the second portions of the first gate dielectric layer include different materials;
a second gate dielectric layer over the first gate dielectric layer, wherein a first portion of the second gate dielectric layer surrounds each of the first stack of channel layers and includes a compound of hafnium oxide and a second metal, wherein the second metal includes yttrium, and a second portion of the second gate dielectric layer surrounds each of the second stack of channel layers and includes hafnium oxide, wherein the first and the second portions of the second gate dielectric layer include different materials;
a third gate dielectric layer over the second gate dielectric layer and surrounding each layer of the first and the second stacks of channel layers, wherein the third gate dielectric layer comprises hafnium oxide; and
a gate work function metal layer over the third gate dielectric layer and surrounding each layer of the first and the second stacks of channel layers, wherein a portion of each of the first, the second, and the third gate dielectric layers is disposed on the substrate and below another portion of the third gate dielectric layer under a bottommost layer of the first and the second stacks of channel layers.

8. The semiconductor structure of claim 7, wherein a concentration of the first metal in the second portion of the first gate dielectric layer is in a range of about 0.2% to about 30%.

9. The semiconductor structure of claim 7, wherein a concentration of the second metal in the first portion of the second gate dielectric layer is in a range of about 0.2% to about 30%.

10. The semiconductor structure of claim 7, wherein the first stack of channel layers includes silicon and the second stack of channel layers includes silicon or silicon germanium.

11. The semiconductor structure of claim 7, wherein the first gate dielectric layer, the second gate dielectric layer, and the third gate dielectric layer provide a triple-layer high-k stack having a thickness in a range of about 6 Angstroms (Å) to 45 Å.

12. A semiconductor structure, comprising:
a substrate;
a first stack of channel layers over the substrate in an NFET region;
a second stack of channel layers over the substrate in a PFET region;
a first gate stack at least laterally surrounding each of the first stack of channel layers; and
a second gate stack at least laterally surrounding each of the second stack of channel layers,
wherein the first gate stack includes a first portion of a first gate dielectric layer, a first portion of a second gate dielectric layer over the first portion of the first gate dielectric layer, a first portion of a third gate dielectric layer over the first portion of the second gate dielectric layer, and a first portion of a gate work function metal layer over the first portion of the third gate dielectric layer,
wherein the second gate stack includes a second portion of the first gate dielectric layer, a second portion of the second gate dielectric layer over the second portion of the first gate dielectric layer, a second portion of the third gate dielectric layer over the second portion of the second gate dielectric layer, and a second portion of the gate work function metal layer over the second portion of the third gate dielectric layer,
wherein the first and the second portions of the first gate dielectric layer include different materials, the first and the second portions of the first gate dielectric layer both include a first high-k dielectric material, the second portion of the first gate dielectric layer further includes a first metal such that a compound of the first high-k dielectric material and the first metal provides an upward adjustment to a work function of the second gate stack, the first metal includes Nb, Ga, Zn, or Ti,
wherein the first and the second portions of the second gate dielectric layer include different materials, the first and the second portions of the second gate dielectric layer both include a second high-k dielectric material, the first portion of the second gate dielectric layer further includes a second metal such that a compound of the second high-k dielectric material and the second metal provides a downward adjustment to a work function of the first gate stack.

13. The semiconductor structure of claim 12, wherein the first high-k dielectric material includes hafnium oxide, and the first metal includes niobium.

14. The semiconductor structure of claim 13, wherein a concentration of the first metal in the second portion of the first gate dielectric layer is in a range of about 0.2% to about 30%.

15. The semiconductor structure of claim 12, wherein the first high-k dielectric material includes HfSiO, HfSiO$_4$, HfSiON, HfLaO, HfTaO, HfSiO, HfZrO, hafnium-aluminum-oxide, hafnium dioxide-alumina alloy, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$, $(Ba,Sr)TiO_3$, $Si_3N_4$, $Nb_2O_3$, HfNbOx, ZnO, or $HfZnO_x$.

16. The semiconductor structure of claim 12, wherein the second high-k dielectric material includes hafnium oxide, and the second metal includes yttrium.

17. The semiconductor structure of claim 16, wherein a concentration of the second metal in the first portion of the second gate dielectric layer is in a range of about 0.2% to about 30%.

18. The semiconductor structure of claim 12, wherein the second high-k dielectric material includes HfSiO, $HfSiO_4$, HfSiON, HfLaO, HfTaO, HfSiO, HfZrO, hafnium-aluminum-oxide, hafnium dioxide-alumina alloy, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$, $(Ba,Sr)TiO_3$, $Si_3N_4$, $Nb_2O_3$, HfNbOx, ZnO, or $HfZnO_x$, where x is greater than 0.

19. The semiconductor structure of claim 12, wherein the second metal includes lanthanum, yttrium, or strontium.

20. The semiconductor structure of claim 12, wherein the first gate stack further includes a first portion of an interfacial layer under the first portion of the first gate dielectric layer, the second gate stack further includes a second portion of the interfacial layer under the second portion of the first gate dielectric layer, wherein the interfacial layer includes silicon dioxide or silicon oxynitride.

* * * * *